US011127457B2

(12) United States Patent
Kim et al.

(10) Patent No.: US 11,127,457 B2
(45) Date of Patent: Sep. 21, 2021

(54) MEMORY DEVICE WITH REDUCED READ DISTURBANCE AND METHOD OF OPERATING THE MEMORY DEVICE

(71) Applicant: Samsung Electronics Co., Ltd., Suwon-si (KR)

(72) Inventors: Jongryul Kim, Dangjin-si (KR); Taehui Na, Seoul (KR); Dueung Kim, Yongin-si (KR); Jongmin Baek, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/803,450

(22) Filed: Feb. 27, 2020

(65) Prior Publication Data

US 2021/0027837 A1 Jan. 28, 2021

(30) Foreign Application Priority Data

Jul. 24, 2019 (KR) ........................ 10-2019-0089794

(51) Int. Cl.
| | |
|---|---|
| *G11C 11/56* | (2006.01) |
| *G11C 11/4074* | (2006.01) |
| *G11C 11/4094* | (2006.01) |
| *G11C 11/4091* | (2006.01) |
| *G11C 11/408* | (2006.01) |

(52) U.S. Cl.
CPC ...... *G11C 11/5642* (2013.01); *G11C 11/4074* (2013.01); *G11C 11/4085* (2013.01); *G11C 11/4091* (2013.01); *G11C 11/4094* (2013.01); *G11C 11/565* (2013.01); *G11C 11/5678* (2013.01)

(58) Field of Classification Search
CPC .................................................. G11C 11/5642
See application file for complete search history.

(56) References Cited

U.S. PATENT DOCUMENTS

| | | | |
|---|---|---|---|
| 5,982,688 | A | 11/1999 | Han |
| 7,760,549 | B2 | 7/2010 | Isobe et al. |
| 7,986,573 | B2 | 7/2011 | Li |
| 8,699,273 | B2 | 4/2014 | Binboga |
| 9,030,906 | B2 | 5/2015 | Rivers et al. |
| 9,129,675 | B2 | 9/2015 | Baek et al. |
| 9,165,647 | B1 | 10/2015 | Guliani et al. |
| 9,171,598 | B2 | 10/2015 | Toda |
| 10,192,620 | B2 | 1/2019 | Kim et al. |

(Continued)

FOREIGN PATENT DOCUMENTS

KR 100938084 1/2010

*Primary Examiner* — Douglas King
(74) *Attorney, Agent, or Firm* — Myers Bigel, P.A.

(57) ABSTRACT

The memory device includes a memory cell array including a plurality of memory cells connected to a plurality of word lines and a plurality of bit lines, a row control circuit including a plurality of row switches corresponding to the word lines, a column control circuit including a plurality of column switches corresponding to the bit lines, and a control logic circuit configured to control pre-charge operations on a word line and a bit line of a selected memory cell and perform a control operation to float the word line and the bit line together after a pre-charge period during a data reading operation. One of the word line and the bit line is floated after the pre-charge period and the other one is pseudo-floated after the pre-charge period.

20 Claims, 20 Drawing Sheets

(56) References Cited

U.S. PATENT DOCUMENTS

| | | | | |
|---|---|---|---|---|
| 2003/0123284 A1* | 7/2003 | Lowrey | ............... | G11C 13/004 |
| | | | | 365/175 |
| 2010/0046275 A1* | 2/2010 | Hosono | ................. | G11C 5/063 |
| | | | | 365/148 |
| 2011/0242885 A1* | 10/2011 | Kim | .................. | G11C 13/0023 |
| | | | | 365/163 |
| 2015/0071005 A1 | 3/2015 | Maejima et al. | | |

* cited by examiner

MEMORY DEVICE WITH REDUCED READ DISTURBANCE AND METHOD OF OPERATING THE MEMORY DEVICE

CROSS-REFERENCE TO RELATED APPLICATION

This application claims the benefit of priority under 35 U.S.C. § 119 to Korean Patent Application No. 10-2019-0089794, filed on Jul. 24, 2019, in the Korean Intellectual Property Office, the disclosure of which is incorporated herein in its entirety by reference.

BACKGROUND

The inventive concepts relate to memory devices, and more particularly, to memory devices with reduced read disturb and methods of reading such a memory device.

With respect to non-volatile memory devices, such as flash memory, resistive memory devices like phase change RAM (PRAM), nano-floating-gate memory (NFGM), polymer RAM (PoRAM), magnetic RAM (MRAM), ferroelectric RAM (FeRAM), and/or resistive RAM (RRAM) are known. A resistive memory device features the high speed of dynamic random access memory (DRAM) and the non-volatile characteristics of a flash memory.

Memory cells of a resistive memory device may have a resistive distribution that depends on programmed data. As an example of a read operation, a current sensing scheme for sensing data may be performed by applying a constant current to a memory cell and reading a voltage that varies according to the resistance of the memory cell. However, in such a current sensing scheme, when the temperature rises significantly, the characteristics of the resistance distribution may be unintentionally changed, which may result in a read disturb error. In particular, word lines and bit lines connected to memory cells may each have a capacitance component. As the capacitance value of the capacitance component increases, read disturb errors may further increase, and thus the number of read cycles with guaranteed reliability may be reduced.

SUMMARY

The inventive concepts provide memory devices capable of reducing read disturb by improving a read operation and methods of operating such memory devices.

According to an aspect of the inventive concepts, there is provided a memory device including a memory cell array including a plurality of memory cells connected to a plurality of word lines and a plurality of bit lines, a row control circuit including a plurality of row switches corresponding to the word lines and configured to perform a selection operation on the word lines, a column control circuit including a plurality of column switches corresponding to the bit lines and configured to perform a selection operation on the bit lines, and a control logic circuit configured to control pre-charge operations on a word line and a bit line of a selected memory cell and perform a control operation to float the word line and the bit line together after a pre-charge period during a data reading operation. One of the word line and the bit line is floated after the pre-charge period and the other one is pseudo-floated after the pre-charge period.

According to an aspect of the inventive concepts, there is provided a memory device including a selected memory cell that is configured to store data, a first line and a second line connected to the selected memory cell, a first switch configured to control an electrical connection between a first driver driving the first line and the first line in response to a first switch control signal, and a second switch configured to control an electrical connection between a second driver driving the second line and the second line in response to a second switch control signal. A data read operation for the selected memory cell includes a pre-charge period, a floating period, and a data sensing period. During the pre-charge period, the memory device is configured to provide a first pre-charge voltage corresponding to a negative target voltage to the first line, to provide a second pre-charge voltage corresponding to a positive target voltage to the second line, to pre-charge the first line to the negative target voltage, and to pre-charge the second line to a level lower than the positive target voltage. During the floating period, the memory device is configured to float the first line and to pseudo-float the second line is pseudo-floated.

According to an aspect of the inventive concepts, there is provided a method of operating a memory device that includes receiving a read command, pre-charging a word line of a selected memory cell that is configured to store data to a first level corresponding to a first target voltage, pre-charging a bit line of the selected memory cell to a second level different from a second target voltage, floating the word line by controlling a row switch connected to the word line, pseudo-floating the bit line by weakly turning on a column switch connected to the bit line by controlling the column switch, and performing data sensing based on a result of detecting the voltage of the word line by electrically connecting the word line to a sense amplifier. At least a portion of a period in which the word line is floated overlaps a period in which the bit line is pseudo-floated.

According to an aspect of the inventive concepts, there is provided a memory module including a module board, a plurality of memory chips mounted on the module board, and a non-volatile memory mounted on the module board and communicating with the memory chips. Each of the memory chips includes a memory cell array comprising a plurality of memory cells connected to a plurality of word lines and a plurality of bit lines, a row control circuit comprising a plurality of row switches corresponding to the word lines and configured to perform a selection operation on the word lines, a column control circuit comprising a plurality of column switches corresponding to the bit lines and configured to perform a selection operation on the bit lines, and a control logic circuit configured to control a pre-charge operation on a word line and a bit line of a selected memory cell during a read operation and perform a control operation to float one of the word line and the bit line after a pre-charge period and to continue to provide a pre-charge voltage to the other one of the word line and the bit line after the pre-charge period.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
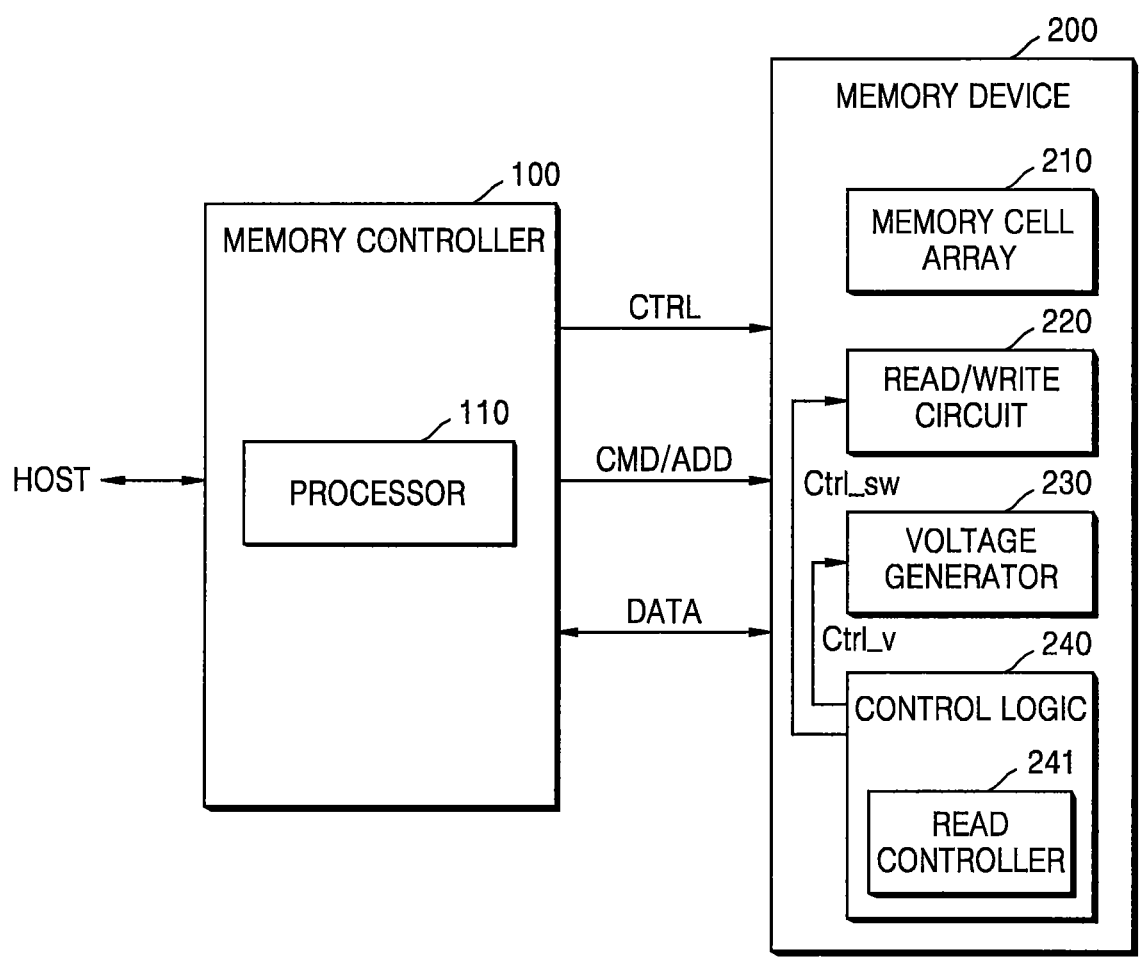
FIG. 1 is a block diagram of a memory system including a memory device according to an embodiment of the inventive concepts.

FIG. 1 is a block diagram of a memory system 10 including a memory device 200 according to an embodiment of the inventive concepts. In some embodiments of the inventive concepts, the memory device 200 may be referred to as a resistive memory device, as the memory device 200 may include resistive memory cells. In some embodiments of the inventive concepts, the memory device 200 may include various other types of memory cells. Also, in some embodiments, the memory cells may be arranged in a region including a plurality of first signal lines and a plurality of second signal lines, and the memory device 200 may be referred to as a cross-point memory device. For example, the memory device 200 may include a plurality of layers and may be configured such that layers adjacent to one another may share at least one signal line. In the embodiments below, it will be assumed that the memory device 200 is a resistive memory device. However, embodiments of the inventive concept may also be applied to various types of memory devices like volatile memory devices and flash memory devices.

In addition, the memory device 200 of FIG. 1 may be implemented in various forms. For example, the memory device 200 may be a device implemented as one memory chip in some embodiments. In some embodiments, the memory device 200 may be implemented as a plurality of memory chips. For example, the memory device 200 may be a memory module in which a plurality of memory chips are mounted on a board. However, embodiments of the inventive concepts are not limited thereto, and the memory device 200 may be implemented in various forms such as a semiconductor package including one or more memory dies.

Referring to FIG. 1, the memory system 10 may include a memory controller 100 and the memory device 200. The memory device 200 may include a memory cell array 210, a read/write circuit 220, a voltage generator 230, and control logic 240. The memory controller 100 may include a processor 110 and, according to the control of the processor 110, the memory controller 100 may control various memory operations for the memory device 200 based on hardware, software, and/or a combination thereof. As used herein, the term "and/or" includes any and all combinations of one or more of the associated listed items.

The memory controller 100 may control the memory device 200 to read data stored in the memory device 200 and/or to write data to the memory device 200 in response to a write/read request from a host HOST. In detail, the memory controller 100 may provide an address ADD, a command CMD, and/or a control signal CTRL to the memory device 200, thereby controlling a program (or write) operation, a read operation, and/or an erase operation for the memory device 200. Also, data DATA to be written and read data DATA may be transmitted and received between the memory controller 100 and the memory device 200.

The memory controller 100 may communicate with the host HOST through various protocols. For example, the memory controller 100 may be configured to communicate with the host HOST via at least one of various protocols such as Universal Serial Bus (USB), MultiMedia Card (MMC), peripheral component interconnect express (PCI-E), advanced technology attachment (ATA), serial-ATA, parallel-ATA, Small Computer System Interface (SCSI), Enhanced Small-Device Interface (ESDI), and/or integrated drive electronics (IDE).

The memory cell array 210 may include a plurality of memory cells (not shown) arranged in regions where a plurality of first signal lines and a plurality of second signal lines cross each other. In an embodiment, a first signal line may be any one of a bit line and a word line, and a second signal line may be the other one of the bit line and the word line. Also, each memory cell may be a single level cell (SLC) storing one bit of data or a multi level cell (MLC) capable of storing at least two bits of data. Also, the memory cells may have a plurality of resistance distributions according to the number of bits stored in each memory cell. For example, when one bit of data is written to one memory cell, the memory cells may have two resistance distributions. When two bits of data are stored in one memory cell, the memory cells have four resistance distributions.

In addition, the memory cell array 210 may include resistive memory cells each including a variable resistor element (not shown). For example, when the variable resistor element is a phase change material (e.g., Ge—Sb—Te (GST)) and the resistance thereof changes according to the temperature, the resistive memory device may be PRAM. In another example, when the variable resistor element includes an upper electrode, a lower electrode, and a complex metal oxide therebetween, the resistive memory device may be RRAM. In another example, when the variable resistor element consists of an upper electrode including a magnetic material, a lower electrode including a magnetic material, and a dielectric material therebetween, the resistive memory device may be MRAM.

The control logic 240 may perform memory operations such as writing and/or reading data by controlling various components of the memory device 200. For example, the read/write circuit 220 may include a row control circuit for controlling word lines of the memory cell array 210 and a column control circuit for controlling bit lines of the memory cell array 210. The row control circuit may include row switches that perform a selection operation on the word lines, and the column control circuit may include column switches that perform a selection operation on the bit lines. As used herein, a control logic may also be referred to as a control logic circuit.

The control logic 240 may output a switch control signal Ctrl_sw for controlling the row switches and the column switches of the read/write circuit 220 in relation to selection operations of memory cells. Also, according to a memory operation of the memory device 200, voltages having various levels may be applied to word lines and bit lines through the read/write circuit 220, and the control logic 240 may output a voltage control signal Ctrl_v for controlling the voltage generator 230.

According to an example embodiment, the control logic 240 may include a read controller 241, and the read controller 241 may control a series of operations related to reading data in the memory device 200. For example, the switch control signal Ctrl_sw and the voltage control signal Ctrl_v may be control signals generated by the read controller 241. In some embodiments, the switch control signal Ctrl_sw and the voltage control signal Ctrl_v may be generated by another component (not shown) in the control logic 240 based on a control operation of the read controller 241.

During a read operation of the memory cell array 210, read voltages may be provided to a selected word line (hereinafter referred to as the word line) and a selected bit line (hereinafter referred to as the bit line) connected to a selected memory cell, respectively. For example, a first pre-charge voltage may be provided to the word line and a second pre-charge voltage may be provided to the bit line, such that a voltage between the word line and the bit line has a level difference corresponding to a certain set value. Also, after pre-charge operations for the word line and the bit line are completed, a voltage detected from at least one of the word line and the bit line may vary according to a program state (e.g., a set state or a reset state) of the selected memory cell.

For example, when an operation for sensing data by using a voltage detected from the word line is performed, the level of the voltage detected from the word line may vary according to the program state of the selected memory cell. When the voltage detected from the word line is greater than a certain reference level, the selected memory cell is in the set state, and thus data "0" may be sensed. When the voltage detected from the word line is less than the certain reference level, the selected memory cell is in the reset state, and thus data "1" may be sensed. In various embodiments, the memory device 200 may be implemented to sense data by using a voltage detected from the bit line. In some embodiments, the memory device 200 may be implemented, such that data "1" is sensed when the selected memory cell is in the set state and data "0" is sensed when the selected memory cell is in the reset state.

During a read operation as described above, word lines and bit lines may each have a large capacitance value. As a result, a current may flow through a memory cell according to a level difference between the word line and the bit line, and a read disturb error may occur as the temperature of the memory cell increases. For example, the word lines and the bit lines may have large capacitance values due to their own capacitance components, capacitance components due to adjacent lines, capacitance components due to connected memory cells, and/or capacitance components due to peripheral circuits connected to the word lines and the bit lines (e.g., a driver circuit and/or a sensing circuit). According to an example embodiment of the inventive concepts, during a data read operation, capacitance values may be reduced by electrically isolating the word lines and the bit lines from peripheral circuits and/or reducing the strength of electrical connections between the word lines and the bit lines and the peripheral circuits, thereby reducing read disturb errors. As a result, the reliability of read cycles may be increased.

For example, the data read operation may include a pre-charge period, a floating period, and a data sensing period and, by controlling a row switch connected to the word line of the selected memory cell and a column switch connected to the bit line of the selected memory cell, the capacitance value(s) described above may be reduced. The switch control signal Ctrl_sw may include a first control signal for controlling the row switch and a second control signal for controlling the column switch and may reduce the capacitance value(s) described above by controlling the row switch and the column switch during the floating period.

In an example of the data read operation, as the word line is pre-charged to a first target voltage and the bit line is pre-charged to a second target voltage, a voltage between the word line and the bit line may have a level difference corresponding to a certain set value. Any one of the first target voltage and the second target voltage may correspond to a positive (+) target voltage, and the other one may correspond to a negative (−) target voltage. Hereinafter, it will be assumed that the first target voltage of the word line corresponds to the negative (−) target voltage and the second target voltage of the bit line corresponds to the positive (+) target voltage.

During the pre-charge period, a first pre-charge voltage corresponding to the first target voltage may be provided to the word line, and a second pre-charge voltage corresponding to the second target voltage may be provided to the bit line. At this time, when a voltage difference between the word line and the bit line becomes greater than a certain reference voltage during the pre-charge period, a memory cell may be turned on (or in an on cell state) and a current may flow. Therefore, during the pre-charge period, the voltage difference between the word line and the bit line may be kept below the certain reference voltage. According to an embodiment, during the pre-charge period, the voltage of the word line may be changed to a level corresponding to the first target voltage, whereas the voltage of the bit line may be changed to a level lower than the second target voltage. For example, the bit line may have a capacitance component (or loading) greater than that of the word line, and the voltage of the bit line may change more slowly even when the pre-charge periods for the word line and the bit line are the same. In some embodiments, by adjusting the pre-charge period for the bit line, the voltage of the bit line may be controlled to change to a level lower than the second target voltage during the pre-charge period.

Subsequently, during the floating period, floating operations for the word line and the bit line may be performed together, thereby reducing the capacitance values of the word line and the bit line. In an example operation, a word line whose level rose to the first target voltage may be floated by turning off the row switch. Further, a resistance due to the column switch may be increased by weakly turning on the column switch, thereby reducing the strength of the electrical connection between the bit line and the peripheral circuits. As used herein, "weakly turning on" a switch means that the switch is biased such that current flows through the switch, but with a higher resistance across the switch. In some embodiments, weakly turning on" a switch may include providing a control signal having a level between logic high and logic low to the switch. For example, if a switch is implemented as a metal-oxide semiconductor field-effect transistor (MOSFET), turning the switch on weakly may involve maintaining the switch in a linear mode of operation of the MOSFET. The state of the bit line according to the operation of the column switch as described above may be referred to as a pseudo-floated state.

During a floating period as described above, the voltage of the word line may be maintained at the first target voltage, and the voltage of the bit line may gradually increase to the second target voltage. For example, when a voltage precharged to the bit line during the pre-charge period is at a first level and the second target voltage is a second level higher than the first level, the bit line that is pseudo-floated during the floating period may rise from the first level to the second level. In other words, since the second pre-charge voltage corresponding to the second target voltage is continuously provided to the bit line and the bit line receives the second pre-charge voltage through a column switch forming a relatively large resistance during the floating period, the voltage of the bit line may gradually rise from the first level to the second level. The resistance of the column switch may vary depending on the degree of pseudo-floating, and, as the resistance increases, the degree of disconnection of electrical connection increases. In addition, the time of the floating period may increase as the voltage level increases more slowly. On the other hand, as the resistance of the column switch decreases, the degree of disconnection of the electrical connection decreases, but the voltage level increases faster. Therefore, the time of the floating period may be reduced.

After the voltage of the word line reaches the first target voltage and the voltage of the bit line reaches the second target voltage, the memory device may enter the data sensing period and detect the voltage(s) of the word line and/or bit line, and thus, a data sensing operation may be performed. During the data sensing period, the row switch and the column switch may be controlled in various ways. For example, the row switch may be turned on, and thus the word line may be electrically connected to a sense amplifier. Also, as the column switch is turned on and charges of the bit line are discharged, the voltage of the bit line may be changed to 0 V. In some embodiments, the state in which the column switch is weakly turned on may be maintained.

According to the example embodiment of the inventive concepts as described above, the voltage level difference between the word line and the bit line may be maintained at a level lower than a certain reference voltage during the pre-charge period, and thus the memory cell may be prevented from entering the on-cell state during the pre-charge period. Also, as the word line and the bit line are floated together during the floating period, the capacitance values of the word line and the bit line may be reduced together during the data sensing operation, and thus read disturb errors may be reduced.

In the above embodiment, the terms floating and pseudo-floating may be used interchangeably in some cases. For example, pseudo-floating of the bit line causes the bit line to have a floating characteristic, and may be described as a type of floating. Also, in relation to a word line and/or bit line that is pseudo-floated, the floating period may also be referred to as a pseudo-floating period.

In some embodiments, the memory controller 100 and the memory device 200 may be implemented as separate semiconductor devices. In some embodiments, the memory controller 100 and the memory device 200 may be integrated into one semiconductor device. For example, the memory controller 100 and the memory device 200 may be integrated into one semiconductor device to constitute a memory card. For example, the memory controller 100 and the memory device 200 may be integrated into one semiconductor device and constitute a Personal Computer Memory Card International Association (PCMCIA) card, a compact flash (CF) card, a smart media card (SM/SMC), a memory stick, a multimedia card (an MMC, an RS-MMC, or an MMCmicro), a Secure Digital (SD, miniSD, or microSD) card, a universal flash storage (UFS), etc.

Figure 2A:
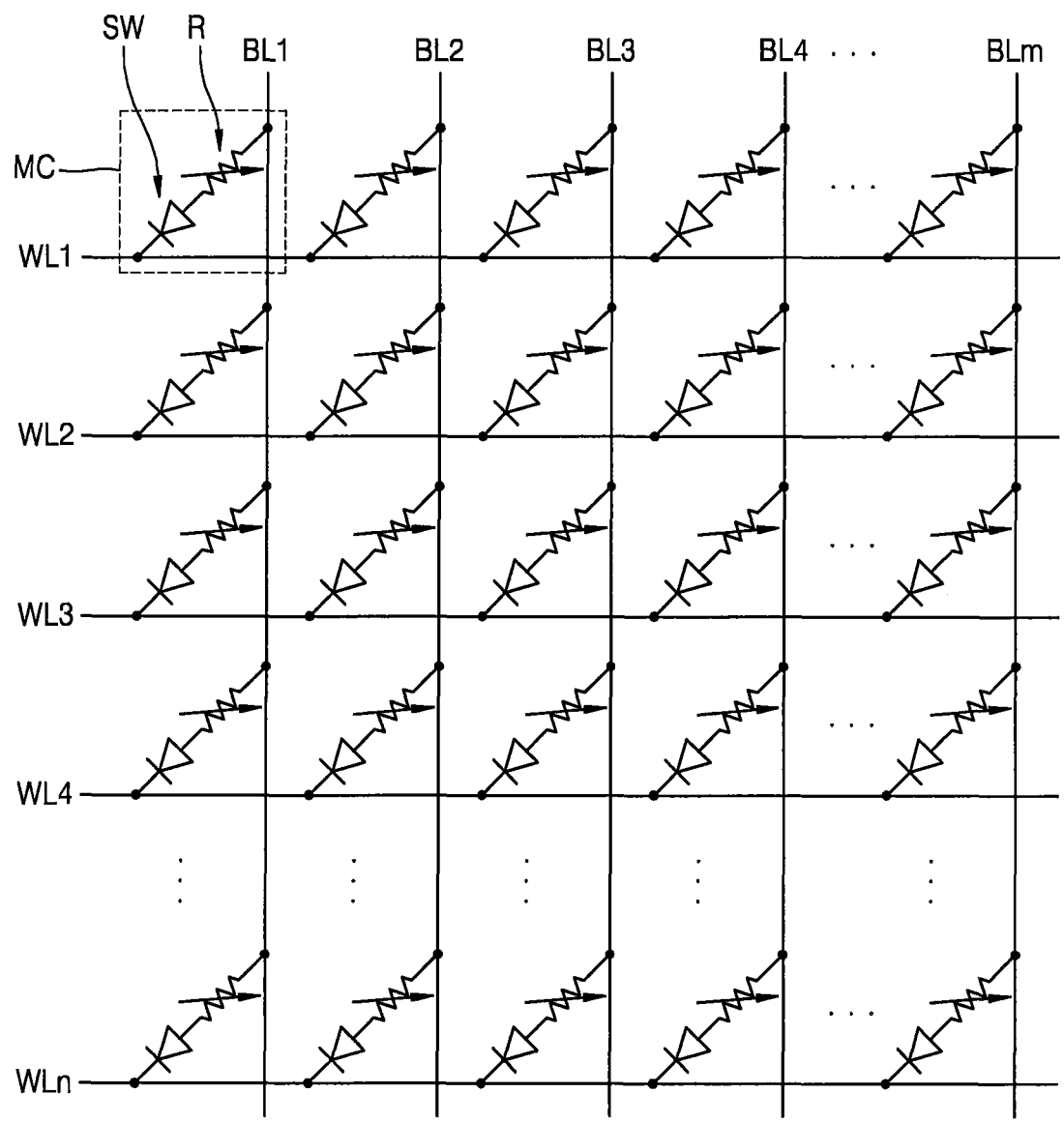
FIGS. 2A and 2B are circuit diagrams of an implementation example of the memory cell array of FIG. 1.
Figure 2B:
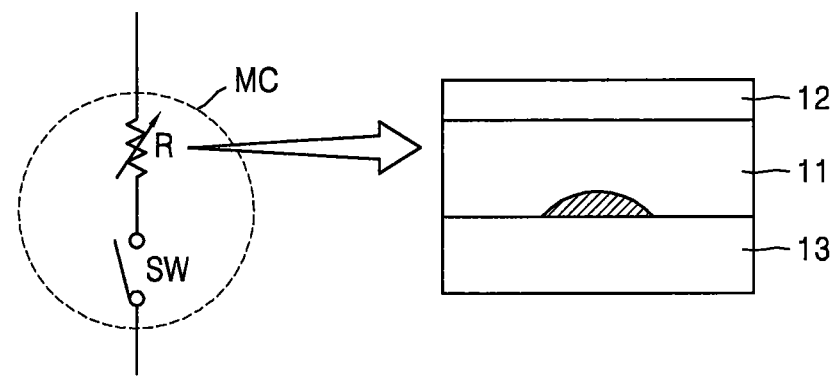

FIGS. 2A and 2B are circuit diagrams of an implementation example of the memory cell array of FIG. 1. FIGS. 2A and 2B illustrate a case where a resistive memory cell is PRAM. The memory cell array 210 shown in FIG. 2A may correspond to one cell block.

The memory cell array 210 may be a two-dimensional memory cell array having a horizontal structure and may include a plurality of word lines WL1 to WLn, a plurality of bit lines BL1 to BLm, and a plurality of memory cells MC, where m and n are natural numbers. A memory cell array may include a plurality of memory blocks. In each memory block, a plurality of memory cells MC may be arranged in rows and columns. Here, the number of word lines WL, the number of bit lines BL, and the number of memory cells MC may vary according to embodiments of the inventive concepts. However, the inventive concepts are not limited thereto. In some embodiments, the memory cell array 210 may be a three-dimensional memory cell array having a vertical structure.

According to the present embodiment, each of the memory cells MC may include a variable resistor element R and a switching element SW. Here, the variable resistor element R may be referred to as a variable resistance material, and the switching element SW may be referred to as a selection element.

In an embodiment, the variable resistor element R may be connected between one of the bit lines BL1 to BLm and the switching element SW, and the switching element SW may be connected between the variable resistor element R and one of the word lines WL1 to WLn. However, the inventive concept is not limited thereto, and the switching element SW may be connected between one of the bit lines BL1 to BLm and the variable resistor element R, and the variable resistor element R may be connected between the switching element SW and one of the word lines WL1 to WLn.

The switching element SW may be connected between any one of the word lines WL1 to WLn and the variable resistor element R, and, according to voltages applied to a respective word line and a bit line connected to the switching element SW, the switching element SW may control supply of a current to the variable resistor element R. In FIG. 2A, the switching element SW may include various types of elements. For example, the switching element SW may include an Ovonic threshold switch (OTS) material. In some embodiments, the switching element SW may include a diode like a PN junction diode or a Schottky diode. Also, in some embodiments, the switching element SW may be replaced with another switchable element.

Referring to FIG. 2B, the memory cell MC may include the variable resistor element R and the switching element SW. The switching element SW may be implemented by using various elements like a transistor and a diode. The variable resistor element R may include a phase change film 11 including, for example, a mixture of germanium, antimony, and tellurium (Ge—Sb—Te (GST)), an upper electrode 12 on the phase change film 11, and a lower electrode 13 below the phase change film 11.

The upper electrode 12 and the lower electrode 13 may include various metals, metal oxides, and/or metal nitrides. The upper electrode 12 and the lower electrode 13 may include aluminum (Al), copper (Cu), titanium nitride (TiN), titanium aluminum nitride ($Ti_xAl_yN_z$), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), iridium oxide ($IrO_2$), strontium zirconate oxide ($StZrO_3$), etc.

The phase change film 11 may include a bipolar resistive memory material and/or a unipolar resistive memory material. The bipolar resistive memory material may be programmed to a set state or a reset state according to the polarity of currents, and Perovskite-based materials may be used as the bipolar resistive memory material. In some embodiments, the unipolar resistive memory material may be programmed to a set state or a reset state by currents having the same polarity, and a transition metal oxide like $NiO_x$ or $TiO_x$ may be used as the unipolar resistive memory material.

A GST material may be programmed between an amorphous state with a relatively high resistivity and a crystalline state with a relatively low resistivity. The GST material may be programmed by heating the GST material. The magnitude and the time of the heating may determine whether the GST material will remain in the amorphous state or the crystalline state. The heating may be performed by using a separate heater, or, when there is no heater, may be performed by joule heat generated as a current passes through a memory cell. In some embodiments, high resistivity and low resistivity may be represented by programmed logic values 0 and 1, respectively, and may be sensed by measuring the resistivity of the GST material. In some embodiments, high resistivity and low resistivity may be represented by programmed logic values 1 and logic 0, respectively.

Figure 3:
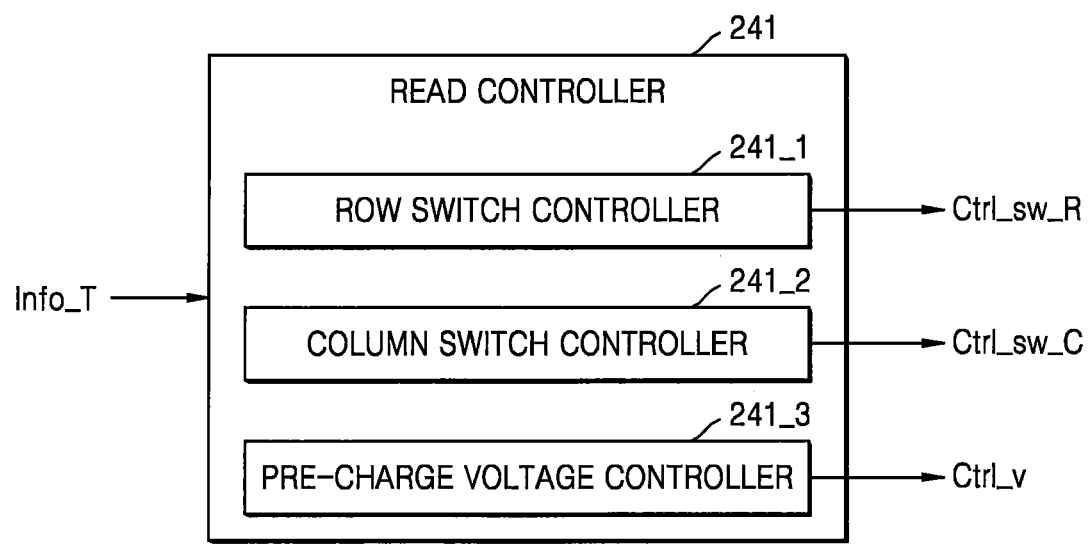
FIG. 3 is a block diagram of an implementation example of the read controller shown in FIG. 1.

FIG. 3 is a block diagram of an implementation example of the read controller shown in FIG. 1.

Referring to FIGS. 1 and 3, the control logic 240 may include the read controller 241, and various control signals according to the above-described embodiments may be generated by the read controller 241. In an example operation, the read controller 241 may receive various types of timing information Info_T in relation to a read operation and generate control signals for controlling pre-charge operations and/or floating operations for word lines and bit lines based on the timing information Info_T. Also, the read controller 241 may generate the voltage control signal Ctrl_v for adjusting the levels of voltages provided to the word line and the bit line in relation to a read operation.

The read controller 241 may include a row switch controller 241_1, a column switch controller 241_2, and a pre-charge voltage controller 241_3. The row switch controller 241_1 may output a row switch control signal Ctrl_sw_R for controlling a row switch that switches a voltage transfer to the word line, and the column switch controller 241_2 may output a column switch control signal Ctrl_sw_C for controlling a column switch that switches a voltage transfer to the bit line.

During a pre-charge period, the row switch and the column switch are turned on by the row switch control signal Ctrl_swR and the column switch control signal Ctrl_sw_C, respectively, and pre-charge operations for the word line and the bit line may be performed. Also, during a floating period, the word line may be floated as the row switch may be turned off by the row switch control signal Ctrl_sw_R, and the bit line may be pseudo-floated as the column switch is weakly turned on by the column switch control signal Ctrl_sw_C. Also, in an operation example, during a data sensing period, the row switch may be turned on by the switch control signal Ctrl_sw_R, and the bit line may be turned on by the column switch control signal Ctrl_sw_C or may be continuously pseudo-floated.

According to an example embodiment, the voltage of the bit line may be changed to a level lower than the second target voltage during the pre-charge period and may rise to the second target voltage during the floating period. At this time, the voltage of the bit line may be adjusted by changing the level of the pre-charge voltage provided to the bit line. For example, the pre-charge voltage controller 241_3 may output the voltage control signal Ctrl_v to the voltage generator 230 based on the timing information Info T, and thus a pre-charge voltage having a level lower than the second target voltage may be provided to the bit line during the pre-charge operation and a pre-charge voltage having a level corresponding to the second target voltage may be provided to the bit line during the floating period.

Figure 4:
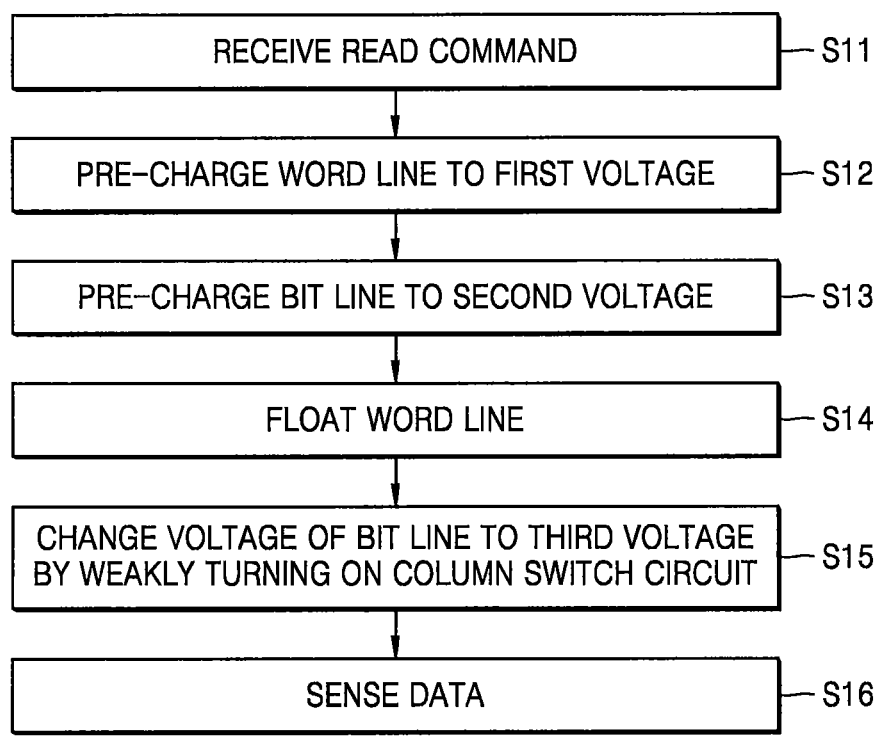
FIG. 4 is a flowchart of a method of operating a memory device, according to an example embodiment of the inventive concepts.

FIG. 4 is a flowchart of a method of operating a memory device, according to an example embodiment of the inventive concepts.

Referring to FIG. 4, a memory device may perform a data read operation according to a request from an external host. For example, a memory controller included in a memory system may provide a read command to a memory device according to a request from a host. The memory device may receive a read command (operation S11) and decode an address provided with the read command to determine a selected memory cell. Also, for a word line and a bit line connected to a selected memory cell, the memory device may pre-charge the word line to a first voltage (operation S12) and pre-charge the bit line to a second voltage (operation S13) during a pre-charge period.

To read data, a voltage between the word line and the bit line may have a level difference corresponding to a certain set value. For example, when the voltage of the word line has a first target voltage corresponding to a negative target voltage and the voltage of the bit line has a second target voltage corresponding to a positive target voltage, the level difference may be realized. During the pre-charge period, the first voltage may correspond to the first target voltage and, when the memory device enters the floating period, the word line may be floated (operation S14). On the other hand, the second voltage of the bit line pre-charged during the pre-charge period may be lower than the second target voltage. As the memory device enters the floating period, the column switch connected to the bit line may be weakly turned on, and, during the floating period, the voltage of the bit line may be changed to a third voltage corresponding to the second target voltage (operation S15). Also, during the floating period, the column switch may form a large resistance, thereby reducing the strength of the electrical connection between the bit line and the peripheral circuits. Also, the capacitance component of the bit line may be reduced.

A voltage level difference between the word line and the bit line may end up corresponding to the above-described certain set value through the floating period as described above, and then a data sensing operation may be performed (operation S16).

Figure 5:
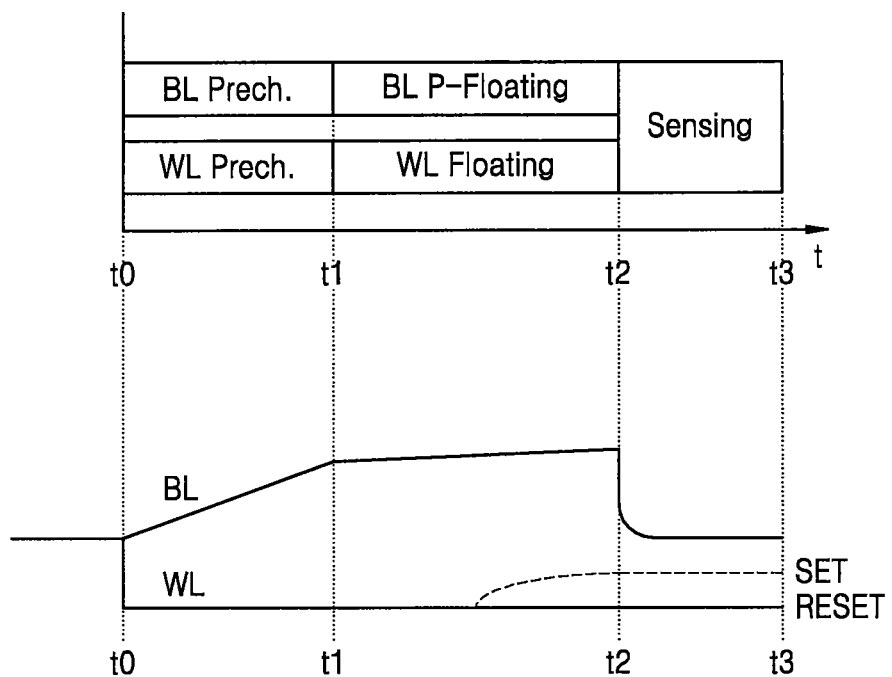
FIG. 5 is a timing diagram of a data read operation according to an example embodiment of the inventive concepts.

FIG. 5 is a timing diagram of a data read operation according to an example embodiment of the inventive concepts. FIG. 5 exemplifies states of a word line WL and a bit line BL connected to a selected memory cell and detected voltage levels.

Referring to FIG. 5, as a memory device receives a read command, a series of operations for reading data stored in a selected memory cell may be performed, and pre-charge operations for the word line WL and the bit line BL may be performed during a pre-charge period t0 to t1. For example, a negative target voltage may be applied to the word line WL, a positive target voltage may be applied to the bit line BL, and the voltages of the word line WL and the bit line BL may be changed during the pre-charge period t0 to t1. In an operation example, a larger number of memory cells are connected to the bit line BL than to the word line WL. Therefore, the capacitance component (or loading) of the bit line BL may be greater than that of the word line WL and, while the voltage of the word line WL may quickly reach a negative target voltage, the voltage of the bit line BL may rise slowly. Although FIG. 5 shows that the voltage of the word line WL is changed to the negative target voltage at a time point t0 for convenience of illustration, the voltage level of the word line WL may be changed with a relatively large slope due to the capacitance component of the word line WL.

During the pre-charge period t0 to t1, the voltage of the bit line BL is changed to a level smaller than the positive target voltage, and thus a voltage level difference between the word line WL and the bit line BL may be a level difference preventing a memory cell from being turned on. Thereafter, during a floating period t1 to t2, the word line WL and the bit line BL may be floated together. According to an embodiment, the word line WL may be switched to a floated state and the bit line BL may be switched to a pseudo-floated state.

A column switch connected to the bit line BL may be weakly turned on, and a pre-charge voltage corresponding to the positive target voltage from the peripheral circuit (e.g., a bit line driver) may be provided to the bit line BL through the column switch. Therefore, the voltage level of the bit line BL may reach the positive target voltage during the floating period t1 to t2. In addition, the selected memory cell may have on-cell characteristics or off-cell characteristics according to the resistance state (a set state or a reset state) of the selected memory cell during the floating period t1 to t2. When the selected memory cell is in the set state, as the level of the bit line BL increases, the selected memory cell may have on-cell characteristics. Therefore, charges of the bit line BL flow to the word line WL through the selected memory cell, and thus the voltage level of the word line WL may rise. In other words, a voltage level detected from the word line WL of the selected memory cell in the set state during the floating period t1 to t2 may be greater than a voltage level detected when the word line WL of the selected memory cell is in the reset state.

When the voltages of the word line WL and the bit line BL are changed to levels suitable for sensing data during the floating period t1 to t2, the voltage of the word line WL may be detected during a data sensing period t2 to t3, thereby sensing data. Also, the column switch may be controlled in various ways. For example, as the column switch is turned on and the bit line BL is discharged, the voltage of the bit line BL may be changed to 0 V.

Although FIG. 5 shows an example in which data is sensed by detecting the voltage of the word line WL, embodiments of the inventive concepts are not limited thereto. A data sensing operation may be performed according to various other embodiments. For example, the voltage level of the bit line BL may be maintained during the data sensing period t2 to t3, and data may be sensed based on a voltage level difference between the bit line BL and the word line WL.

The terms defined in the above-described embodiment are merely examples, and embodiments of the inventive concepts are not limited thereto. For example, in the above-described embodiment, the description with respect to the word line may correspond to the bit line and the description with respect to the bit line may correspond to the word line (e.g., the designation of the word line and the bit line may be interchanged). Also, a first line may be defined as any one of a word line and a bit line, and a second line may be defined as the other one of the word line and the bit line.

Although it is described above that the word line WL and the bit line BL are simultaneously floated in the above-described embodiment, embodiments of the inventive concepts are not limited thereto. The word line WL and/or the bit line BL may be floated at various time points. For example, pseudo-floating of the bit line BL may be initiated during a period in which the word line WL is floated. Also, in the above example, the terms "pre-charge period" and "floating period" are commonly used for the word line WL and the bit line BL. In some embodiments, the word line WL and the bit line BL may be separately controlled at different timings from each other, and the pre-charge period and the floating period described above may be divided into a word line WL pre-charge period, a word line WL floating period, a bit line BL pre-charge period, and a bit line BL floating period.

Figure 6:
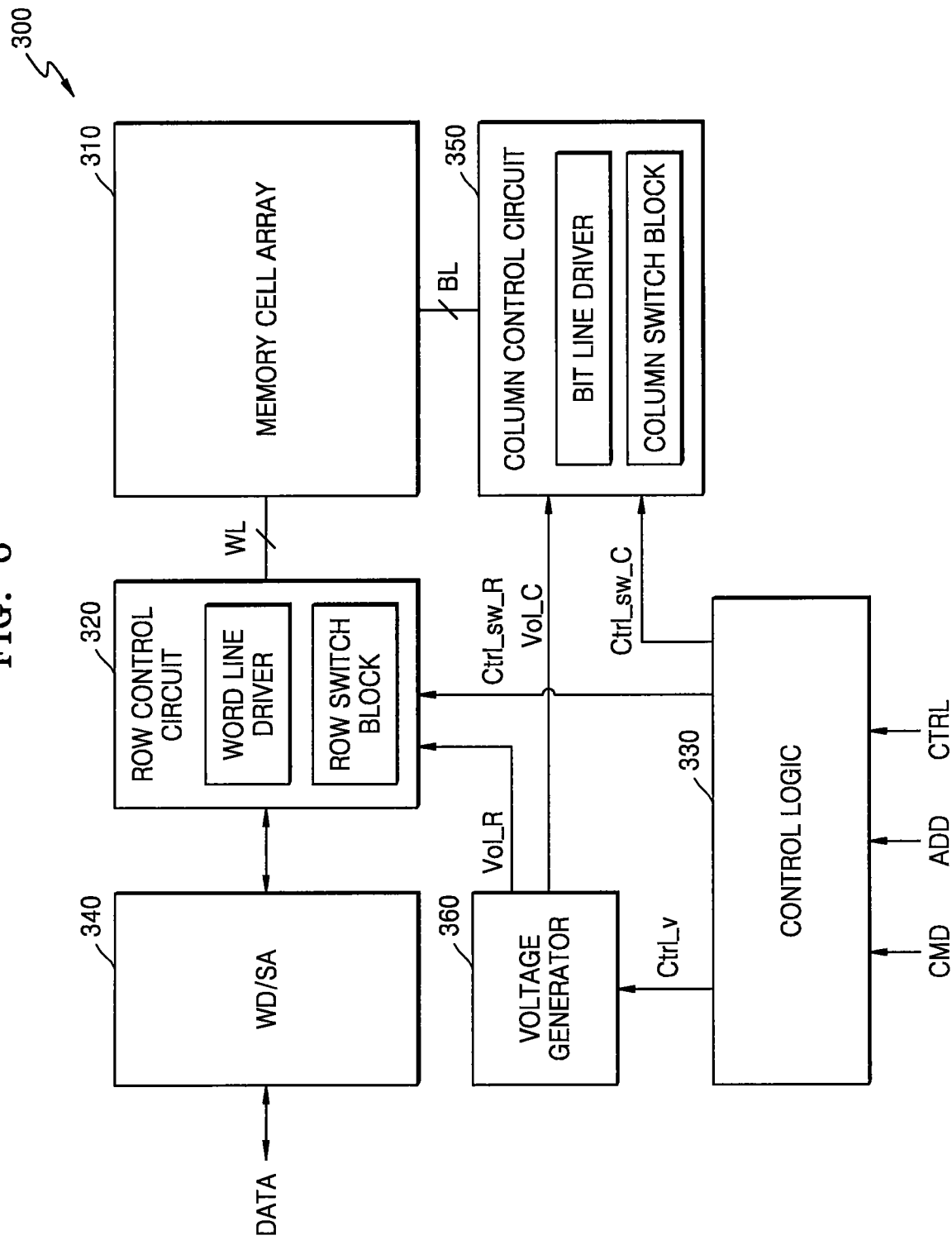
FIG. 6 is a block diagram of an example implementation of a memory device according to an example embodiment of the inventive concepts.

FIG. 6 is a block diagram of an example implementation of a memory device 300 according to an example embodiment of the inventive concepts.

Referring to FIG. 6, a memory device 300 may include a memory cell array 310, a row control circuit 320, control logic 330, a write driver/sense amplifier 340, a column control circuit 350, and a voltage generator 360. Also, the memory device 300 may further include various other components related to memory operations.

The control logic 330 may control memory operations according to various signals from a memory controller. For example, the control logic 330 may control memory operations like writing and/or reading data according to a command CMD from the memory controller and may select a memory cell according to an address ADD provided by the memory controller. In some embodiments, the control logic 330 may also receive a control signal CTRL from the memory controller. The address ADD may include a row address for selecting word lines WL of the memory cell array 310 and a column address for selecting bit lines BL of the memory cell array 310. Also, a write driver/sense amplifier 340 may be connected to the word lines WL through the row control circuit 320 and write data DATA to memory cells or read the data DATA from the memory cells based on an internal control signal from the control logic 330.

The row control circuit 320 may include a word line driver that provides one or more voltages to the word lines WL and/or a row switch that performs a selection operation on the word lines WL. The row switch may include a plurality of row switches arranged in correspondence to the word lines WL. As the row switches are turned on, voltages from the word line driver may be provided to the word lines WL through the row switches. Similarly, the column control circuit 350 may include a bit line driver that provides one or more voltages to the bit lines BL and/or a column switch that performs a selection operation on the bit lines BL. In the above-described embodiment, a pseudo-floating operation on the bit lines BL may be performed by weakly turning on (or weakly turning off) column switches of the column switch included in the column control circuit 350.

According to an example embodiment of the inventive concepts, the control logic 330 may control a series of operations for reading data and perform control operations for the word lines WL and the bit lines BL during a pre-charge period and/or a floating period according to the above-described embodiments. For example, the control logic 330 may output the voltage control signal Ctrl_v to the voltage generator 360 and control the voltage generator 360 to generate a pre-charge voltage. The voltage generator 360 may provide a first pre-charge voltage Vol_R to the row control circuit 320 and provide a second pre-charge voltage Vol_C to the column control circuit 350. For example, according to the above-described embodiments, the first pre-charge voltage Vol_R corresponding to a negative target voltage may be provided to the row control circuit 320, and the second pre-charge voltage Vol_C corresponding to a positive target voltage may be provided to the column control circuit 350.

Also, the control logic 330 may provide the row switch control signal Ctrl_sw_R to the row control circuit 320 to control the row switch and also provide the column switch control signal Ctrl_sw_C to the column control circuit 350 to control the column switch. According to the above-described embodiments, during a floating period, a row switch connected to a selected memory cell may be turned off in response to the row switch control signal Ctrl_sw_R, and a column switch connected to the selected memory cell may be weakly turned on in response to the column switch control signal Ctrl_sw_C. Also, during a data sensing period, the write driver/sense amplifier 340 may detect a voltage from a word line connected to the selected memory cell, amplify the voltage, and output read data DATA.

The configuration and operation of the memory device 300 in the above-described embodiment may be modified in various ways. For example, a degree to which the bit line is floated may vary according to the strength of turning on the column switch during the floating period. The weaker the switch is turned on, the greater the resistance formed by the column switch becomes. Therefore, as the column switch is weakly turned on, the capacitance component of the bit line may be significantly reduced, whereas the level of a voltage applied to the bit line rises slowly. Therefore, the floating period may become longer. In other words, by controlling the turning-on strength of the column switch, the degree of disconnection of the electrical connection between the bit line and peripheral circuits may be changed, and time elapsed for reading data may also be changed by adjusting the floating period.

Figure 7A:
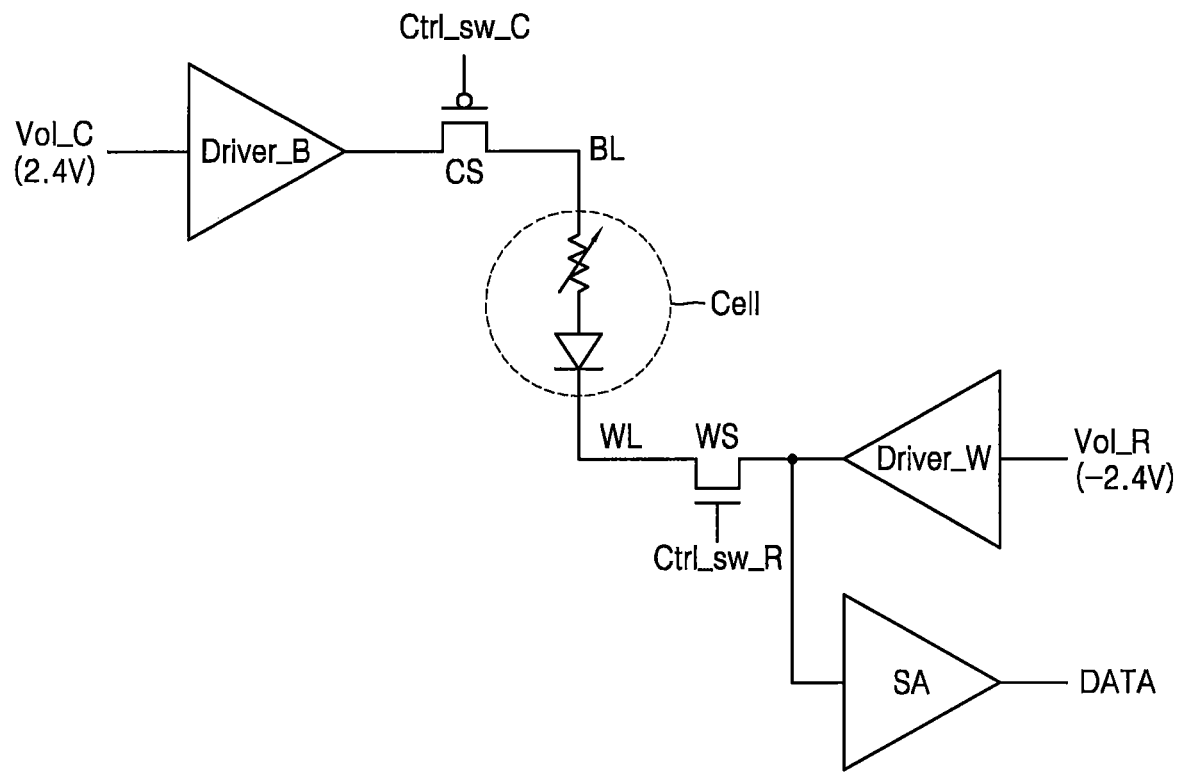
FIGS. 7A, 7B, and 7C are circuit diagrams and a waveform diagram of an example of a read operation of the memory device of the inventive concepts.
Figure 7B:
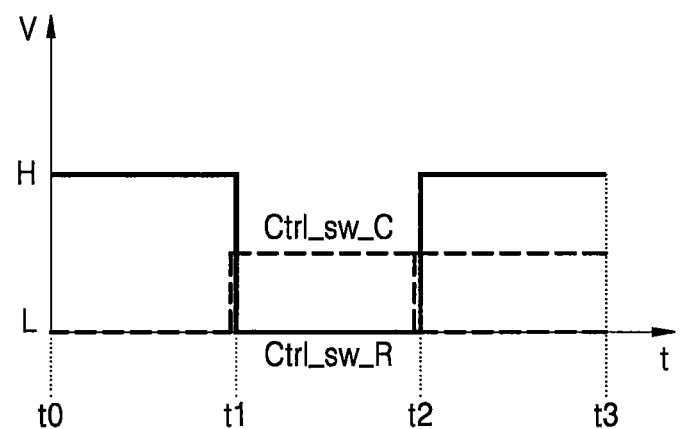
Figure 7C:
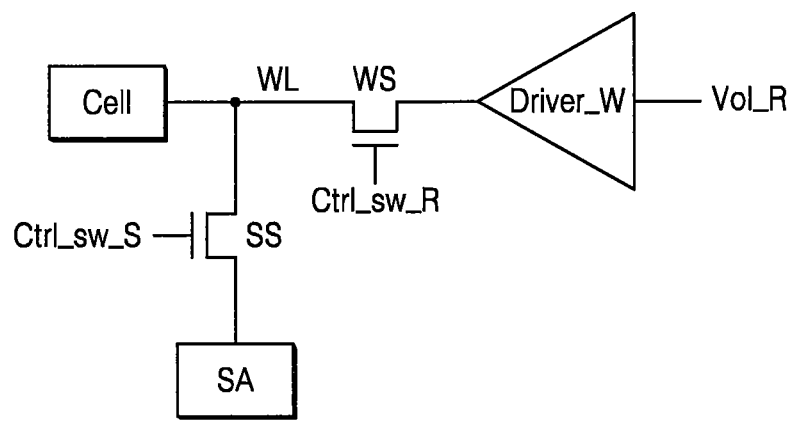

FIGS. 7A, 7B, and 7C are circuit diagrams and a waveform diagram of an example of a read operation of the memory device of the inventive concepts.

Referring to FIG. 7A, a bit line driver Driver_B may be connected to the bit line BL of a selected memory cell through a column switch CS, and a word line driver Driver_W may be connected to the word line WL of the selected memory cell through a row switch WS. In addition, control logic (not shown) included in the memory device may generate various control signals related to a data read operation. For example, the column switch CS may be controlled by the column switch control signal Ctrl_sw_C, and the row switch WS may be controlled by the row switch control signal Ctrl_sw_R. A sense amplifier SA may detect a voltage applied to one node of the word line WL and may perform a data sensing operation therethrough.

The first pre-charge voltage Vol_R may be provided to the word line WL through the word line driver Driver_W, and the second pre-charge voltage Vol_C may be provided through the bit line driver Driver_B. Also, according to the above-described embodiments, the first pre-charge voltage Vol_R may have a negative target voltage and the second pre-charge voltage Vol_C may have a positive target voltage. FIG. 7A shows an example in which the first pre-charge voltage Vol_R corresponds to −2.4 V and the second pre-charge voltage Vol_C corresponds to 2.4 V, but the inventive concepts are not limited thereto. During the pre-charge period of the above-described embodiments, the word line WL may be pre-charged to −2.4 V, while the bit line BL may be pre-charged to a level lower than 2.4 V.

FIG. 7B shows an example of waveforms of the row switch control signal Ctrl_sw_R and the column switch control signal Ctrl_sw_C. Although FIG. 7B shows a case in which the row switch WS is implemented as an NMOS transistor and the column switch CS is implemented as a PMOS transistor, embodiments of the inventive concepts are not limited thereto, and various modifications may be made therein.

Referring to FIG. 7B, the row switch control signal Ctrl_sw_R has a logic high level and the column switch control signal Ctrl_sw_C has a logic low level during a pre-charge period t0 to t1. Therefore, the row switch WS and the column switch CS may be turned on, and pre-charge operations may be performed on the word line WL and the bit line BL. Next, during a floating period t1 to t2, the row switch control signal Ctrl_sw_R has a voltage level corresponding to logic low. Therefore, the row switch WS may be turned off, whereas the column switch control signal Ctrl_sw_C may have a voltage level between logic high and logic low, and thus the column switch CS may be weakly turned on to correspond to the pseudo-floated state.

Thereafter, the row switch WS and the column switch CS may be controlled in various ways during a data sensing period t2 to t3. For example, when both the sense amplifier SA and the word line driver Driver_W shown in FIG. 7A are connected to the word line WL through the row switch WS, the row switch control signal Ctrl_sw_R has a logic high level, and thus the row switch WS may be turned on. In addition, according to an example embodiment, as the column switch CS is turned on during the data sensing period t2 to t3, a discharging operation on the bit line BL may be performed.

FIG. 7C shows an embodiment for reducing the capacitance component of the word line WL due to the sense amplifier SA during a data sensing operation, wherein an additional switch (e.g., a sense amplifier selection switch SS) may be provided between the word line WL and the sense amplifier SA, and the sense amplifier selection switch SS may be controlled by an additional control signal Ctrl_sw_S.

According to the above-described embodiment, the word line WL and the sense amplifier SA may be electrically connected to each other during the data sensing period t2 to t3. At this time, the sense amplifier selection switch SS is controlled to a pseudo-floated state, and thus the capacitance components of the word line WL may be reduced while the sense amplifier SA is sensing the voltage of one node of the word line WL. In other words, according to an example embodiment of the inventive concepts, the pseudo-floated states for the word line WL and the bit line BL may be controlled together.

Figure 8A:
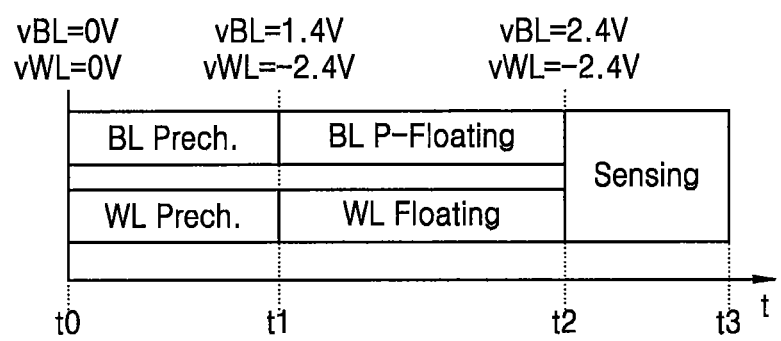
FIGS. 8A, 8B, and 8C are block diagrams of a data read operation and a memory device for performing the same, according to an example embodiment of the inventive concepts.
Figure 8B:
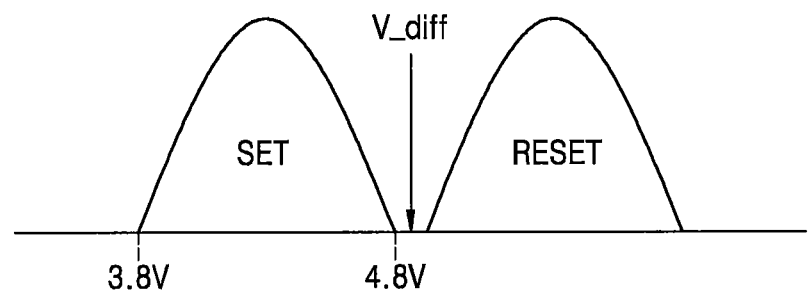
Figure 8C:
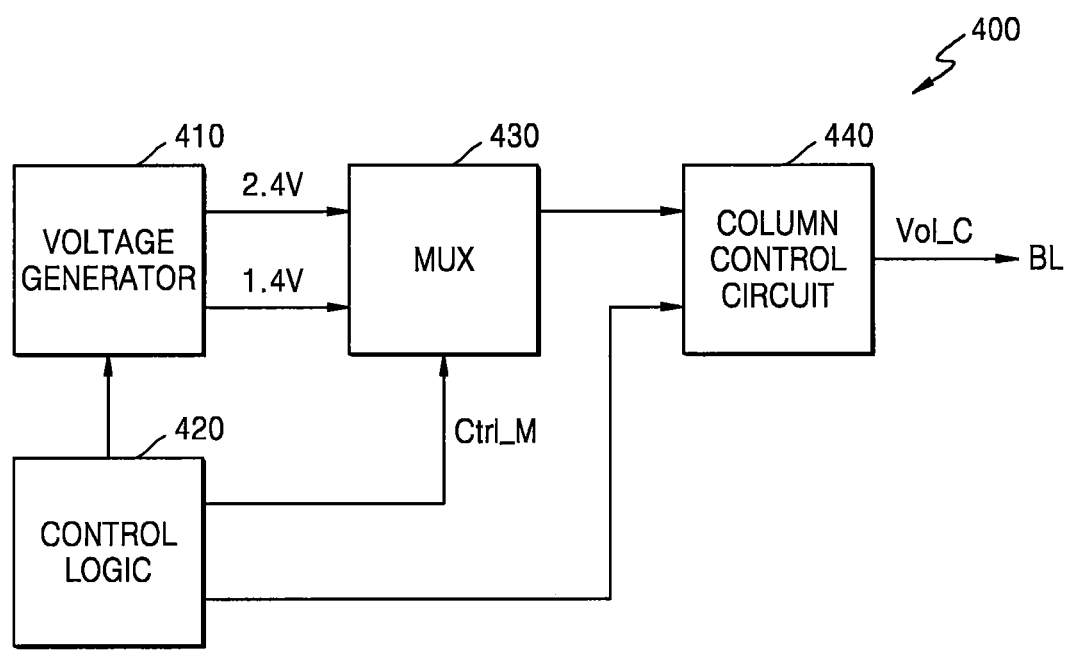

FIGS. 8A, 8B, and 8C are block diagrams of a data read operation and a memory device for performing the same, according to an example embodiment of the inventive concepts. FIGS. 8A, 8B, and 8C show a case where data reading is performed by changing the level of a pre-charge voltage applied to a word line and/or a bit line. Also, in FIGS. 8A, 8B, and 8C, the word line is pre-charged to a negative target voltage and the bit line is pre-charged to a positive target voltage.

Referring to FIG. 8A, before the pre-charge period t0 to t1 is performed, a voltage vWL of a word line and a voltage vBL of the bit line that are connected to the selected memory cell may have values of 0 V. As the charge period t0 to t1 is performed, the levels of the voltage vWL of the word line and the voltage vBL of the bit line may be changed. For example, a pre-charge voltage of −2.4 V corresponding to a negative target voltage may be provided to the word line WL, and the voltage vWL of the word line may be changed to −2.4 V during the pre-charge period t0 to t1. Also, during the pre-charge period t0 to t1, a pre-charge voltage having a voltage less than the positive target voltage (that is, 1.4 V) may be provided to the bit line BL, and the voltage vBL of the bit line BL may rise to the level of 1.4 V.

Thereafter, during the floating period t1 to t2, the word line WL may be floated, the bit line BL may be pseudo-floated, and a pre-charge voltage of 2.4 V corresponding to the positive target voltage may be provided to the bit line BL. Therefore, the voltage of the bit line BL may rise to 2.4 V during the floating period t1 to t2. Also, according to the above-described embodiments, voltages of levels different from one another may be detected from the word line WL according to the resistance state of the selected memory cell, and data may be sensed through the word line WL during the data sensing period t2 to t3.

FIG. 8B is a graph showing an on-cell characteristic or an off-cell characteristic according to resistance distributions, wherein the horizontal axis represents voltage level differences between the word line WL and the bit line BL, and the vertical axis represents the numbers of memory cells. For example, a memory cell in a set state may have an on-cell characteristic when a difference between the voltage levels of the word line WL and the bit line BL is greater than about 3.8 V, and a memory cell in a reset state may have an on-cell characteristic when a difference between the voltage levels of the word line WL and the bit line BL is greater than 4.8 V. Also, a voltage level difference Vdiff between the word line WL and the bit line BL for sensing data may be set to have a value that is approximately the median value of the distribution of the set state and the reset state.

According to the above-described embodiments, by maintaining the voltage level difference Vdiff between the word line WL and the bit line BL below or equal to 3.8 V during a pre-charge period, a memory cell may be prevented from having an on-cell characteristic during the pre-charge operation. Also, the voltage level difference Vdiff between the word line WL and the bit line BL during a floating period may have a value through which a memory cell in the set state and a memory cell in the reset state may be determined.

FIG. 8C shows an example of changes of the levels of voltages provided to a word line and a bit line during a data read operation. As shown in FIG. 8C, a memory device 400 may include a voltage generator 410, control logic 420, a selector (MUX) 430, and a column control circuit 440.

The control logic 420 may change the level of a pre-charge voltage output from the voltage generator 410 by controlling the voltage generator 410. Also, the control logic 420 may select a pre-charge voltage provided to the column control circuit 440 by controlling the MUX 430. Furthermore, according to the above-described embodiments, the column control circuit 440 includes column switches (not shown), and the control logic 420 may control the column switches to adjust the turn-on/turn-off state, the floated state, and the pseudo-floated state of the column switches.

According to the above embodiments, the voltage generator 410 may generate a pre-charge voltage of 1.4 V and a pre-charge voltage of 2.4 V and, during the pre-charge period, the MUX 430 may selectively provide the pre-charge voltage of 1.4 V to the column control circuit 440 in response to a selection signal Ctrl_M. Also, during the floating period, the MUX 430 may selectively provide the pre-charge voltage of 2.4 V to the column control circuit 440 in response to the selection signal Ctrl_M and, based on the control of the control logic 420, a column switch connected to a bit line may be weakly turned on.

Figure 9:
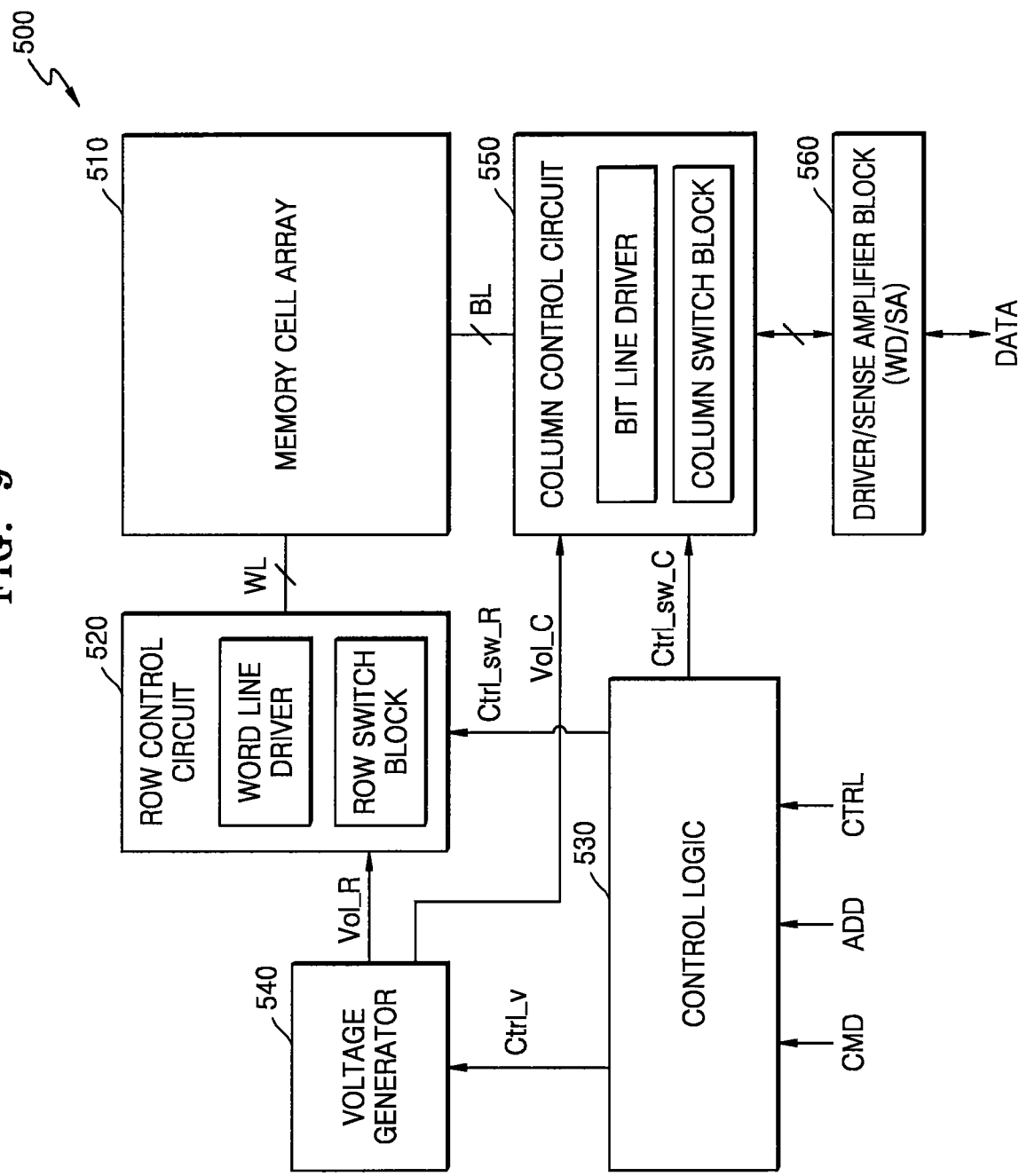
FIGS. 9 and 10 are block diagrams of an example implementation of a memory device according to another example embodiment of the inventive concepts.
Figure 10:
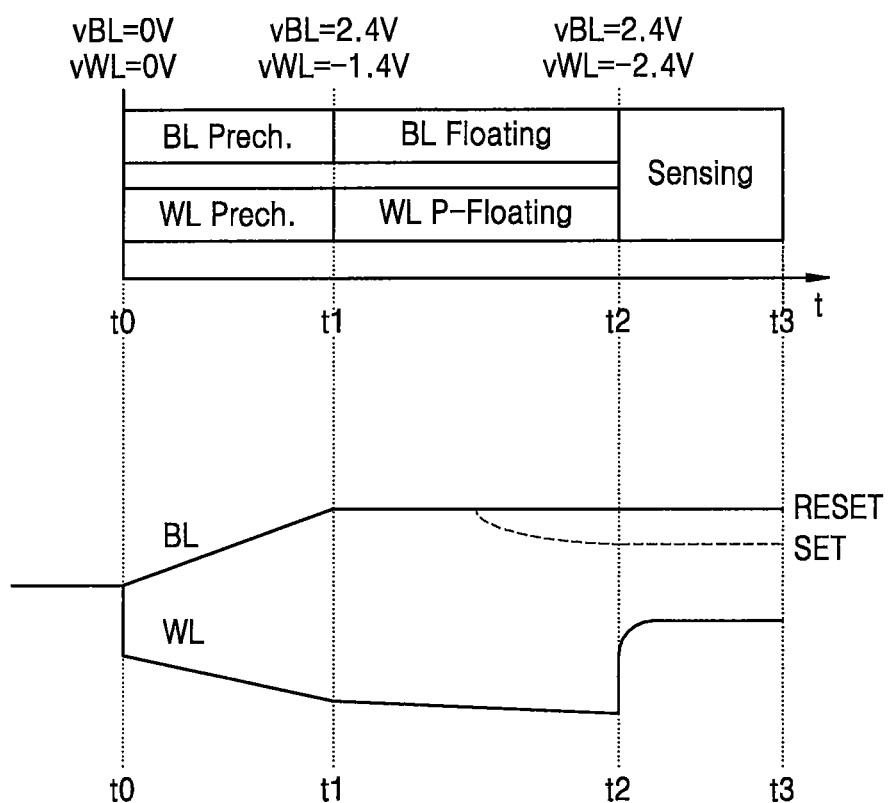

FIGS. 9 and 10 are block diagrams of an example implementation of a memory device 500 according to another example embodiment of the inventive concepts. FIGS. 9 and 10 show examples in which a word line is pseudo-floated during a data reading operation.

Referring to FIG. 9, a memory device 500 includes a memory cell array 510, a row control circuit 520, control logic 530, a voltage generator 540, a column control circuit 550, and a write driver/sense amplifier 560. According to the above-described embodiments, the row control circuit 520 may include a word line driver and a row switch, and the column control circuit 550 may include a bit line driver and a column switch. Also, the control logic 530 may receive a command CMD, an address ADD, and a control signal CTRL from a memory controller and control memory operations of the memory device 500 based on them. Other elements of FIG. 9 are similar to those described herein with respect to FIG. 6, and a duplicate description thereof will be omitted for brevity.

In the embodiment shown in FIG. 9, data may be sensed by detecting a voltage of a bit line connected to a selected memory cell. According to the above-described embodiments, a positive target voltage may be provided to a bit line and a negative target voltage may be provided to a word line. According to the present embodiment, during a pre-charge period, the voltage of the word line may be changed to a negative voltage higher than the negative target voltage, whereas the voltage of the bit line may be changed to a level higher than the negative target voltage. Also, during a floating period, the bit line may be floated and the word line may be pseudo-floated, and thus the voltage of the word line may be changed to the negative target voltage during the floating period.

To describe the present embodiment with reference to FIG. 10, during a pre-charge period t0 to t1, pre-charge operations may be performed on the word line and the bit line connected to the selected memory cell. During the pre-charge period t0 to t1, the voltage vBL of the bit line may be changed to 2.4 V (e.g., from 0 V to 2.4V) corresponding to the positive target voltage, whereas the voltage vWL of the word line may be changed to −1.4 V (e.g., from 0V to −1.4V), higher than the negative target voltage.

Thereafter, during the floating period t1 to t2, the bit line may be switched to the floated state, the word line may be switched to the pseudo-floated state, and, during the floating period t1 to t2, the word line voltage vWL may be changed to −2.4 V (e.g., from −1.4V to −2.4V) corresponding to the negative target voltage. Also, during the floating period t1 to t2, a voltage level difference between the word line and the bit line may increase, and, when the resistance state of the selected memory cell is in the set state, the selected memory cell may have an on-cell characteristic. Therefore, the voltage vBL of the bit line may be changed. For example, the voltage vBL of the bit line of the selected memory cell in the set state may be smaller than the voltage vBL of the bit line of the selected memory cell in the reset state. During a data sensing period t2 to t3, the write driver/sense amplifier 460 may sense data of the selected memory cell based on a voltage level detected from the bit line.

However, the embodiments of the inventive concept are not limited to the waveform of the voltage levels shown in FIG. 10. For example, the changing characteristic of the voltage levels of the word lines WL and the bit lines BL may be different from the waveform shown in FIG. 10. For example, the voltage levels of the word lines WL and the bit lines BL may vary from those illustrated in FIG. 10 according to the capacitance components of the word lines WL and the bit lines BL.

Meanwhile, although it is described in the above embodiment that periods in which word lines and bit lines are controlled may have the same timings, embodiments of the inventive concepts are not limited thereto. For example, the word lines WL and the bit lines BL may be controlled separately, and thus at least one of a pre-charge period and a floating period for the word lines WL may be different from the other. For example, pre-charge operations may be performed on the word lines WL and the bit lines BL at different timings and may also be completed at different timings.

Figure 11:
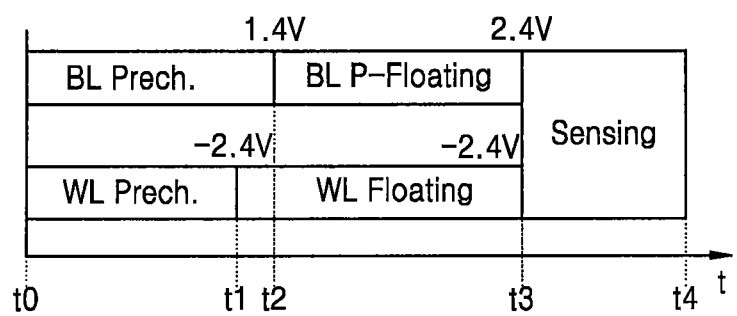
FIGS. 11 and 12 are timing diagrams of data read operations performed according to example embodiments of the inventive concepts.
Figure 12:
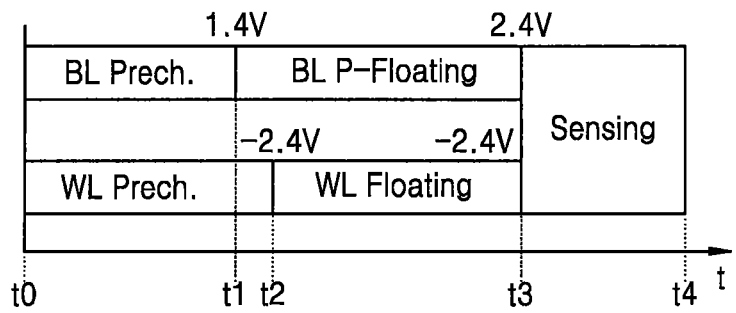

Hereinafter, examples in which a data read operation is performed by controlling a pre-charge period and a floating period will be described. FIGS. 11 and 12 are timing diagrams of data read operations performed according to example embodiments of the inventive concepts. In the embodiments below, it will be assumed that the target voltage of a word line for sensing data corresponds to −2.4 V and the target voltage of a bit line corresponds to 2.4 V, but the inventive concepts are not limited thereto.

Referring to FIG. 11, a word line and a bit line connected to a selected memory cell may be controlled separately from each other, and thus pre-charge periods and floating periods may be adjusted differently for the word line and the bit line. For example, FIG. 11 shows an example in which the bit line has a larger capacitance component than that of the word line, and thus the voltage of the bit line changes slowly as compared to that of the word line during a pre-charge period.

During a pre-charge period t0 to t1 for the word line, a pre-charge voltage of −2.4 V corresponding to a negative target voltage is provided to the word line, and, during the pre-charge period t0 to t1, the voltage of the word line may be changed to −2.4 V. On the other hand, a pre-charge period t0 to t2 for the bit line may be longer than the pre-charge period t0 to t1 for the word line, and, even when a pre-charge voltage of 2.4 V corresponding to a positive target voltage is provided to the bit line, the voltage of the bit line may rise to 1.4 V during the pre-charge period t0 to t2.

Meanwhile, the word line may be floated earlier (e.g., at time t1) than the bit line, and the bit line may be pseudo-floated during a floating period t2 to t3 for the bit line. Also, the voltage of the bit line may slowly increase to 2.4 V (e.g., from 1.4V to 2.4V) during the floating period t2 to t3 for the bit line. Thereafter, a data sensing operation may be performed during a data sensing period t3 to t4, and, according to the above-described embodiments, the voltage of the word line may have different levels depending on the resistance states of the selected memory cell.

Referring to FIG. 12, a pre-charge voltage of −2.4 V corresponding to the negative target voltage may be provided to the word line, and a pre-charge voltage of 2.4 V corresponding to the positive target voltage may be provided to the bit line. During a pre-charge period, the voltage levels of the word line and the bit line may be changed. For example, since the change of the voltage level of the word line is greater than that of the bit line during the pre-charge period, a pre-charge period t0 to t2 for the word line may be longer than a pre-charge period t0 to t1 for the bit line. The voltage of the selected word line may be changed to −2.4 V during the pre-charge period t0 to t2 for the word line. Also, the word line may enter the floating period t2 to t3 after the pre-charge period t0 to t2.

Meanwhile, the pre-charge period t0 to t1 for the bit line may be relatively short, and thus the voltage of the bit line may be pre-charged to a level lower (e.g., 1.4 V) than 2.4 V corresponding to the positive target voltage. When the voltage of the bit line is lower than the positive target voltage, the bit line may enter a floating period t1 to t3. According to the above-described embodiments, the bit line may be pseudo-floated during the floating period t1 to t3, and the voltage of the bit line may rise to 2.4 V (e.g., from 1.4 V to 2.4 V). Thereafter, a data sensing operation may be performed during a data sensing period t3 to t4.

Although an example in which a timing for pseudo-floating the bit line is adjusted in contrast to the word line has been described in the above-described embodiments, timings of various periods according to the inventive concepts may be adjusted in various ways. For example, in case of a plurality of bit lines, the bit lines may have different capacitance components from one another due to various factors like distances to peripheral circuits. Therefore, different interval timings may be applied to the bit lines, respectively, and different strengths for turning on the column switch (or electrical connection strengths) may be applied to the bit lines, respectively.

According to an example embodiment, the timing for pseudo-floating the bit line may be adjusted in consideration of memory cell characteristics. For example, memory cells may be turned on at different timings according to threshold voltages of switching elements. This may cause self-induced read disturbs (SIRDs) of memory cells different from one another. According to the above-described embodiments, a SIRD due to the capacitance component may be reduced, and differences between SIRDs of memory cells may be compensated for through adjustment of timings as described above.

Figure 13:
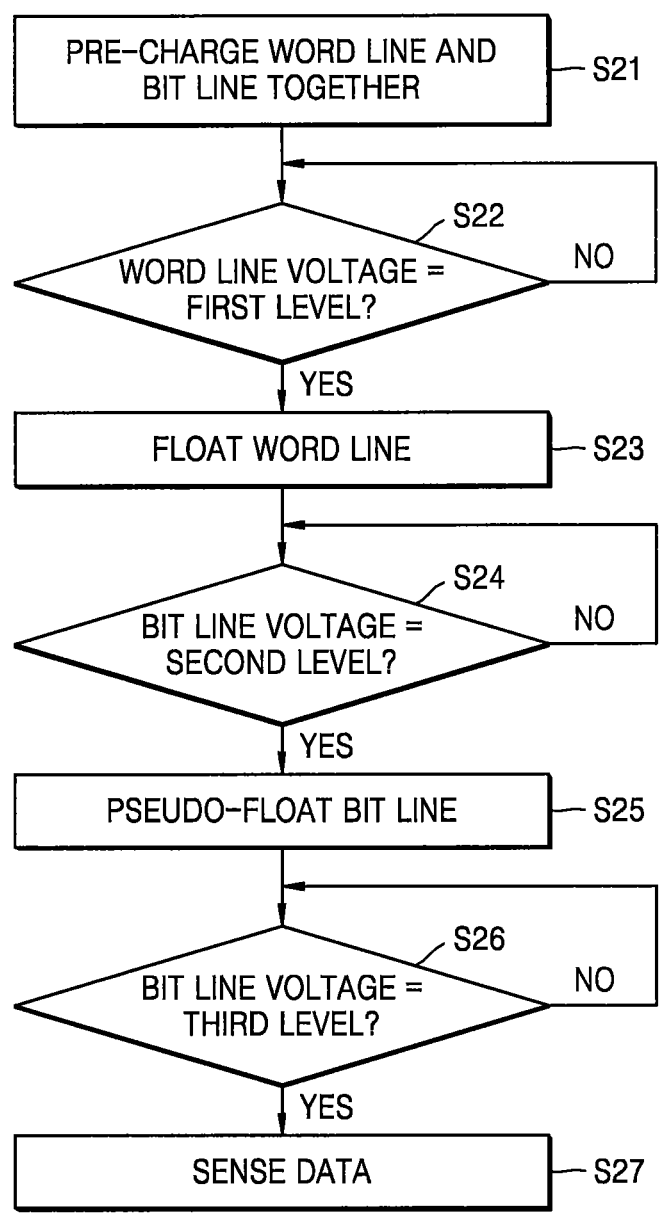
FIG. 13 is a flowchart of a method of operating a memory device, according to various example embodiments of the inventive concepts.

FIG. 13 is a flowchart of a method of operating a memory device, according to various example embodiments of the inventive concepts.

Referring to FIG. 13, a memory device may include a plurality of memory cells and a plurality of word lines and a plurality of bit lines connected to the memory cells, and a word line and a bit line connected to a selected memory cell to read data of the selected memory cell may be pre-charged together (operation S21). The word lines and the bit lines of the memory device may be controlled separately, and it may be determined whether the voltage of a word line reached a first level corresponding to a target voltage (e.g., a negative target voltage) through the pre-charge operation (operation S22). While the voltage of the word line has not reached the first level ("NO" in operation S22), the pre-charge operation may be continued and/or repeated. When the voltage of the word line reaches the first level, a pre-charge period for the word line may be terminated, and the word line may be switched to the floated state (operation S23).

Meanwhile, an operation for detecting the voltage of the bit line may be performed. For example, it may be determined whether the voltage of the bit line has risen to a second level lower than a target voltage (e.g., a positive target voltage) through a pre-charge operation (operation S24). While the voltage of the bit line has not reached the second level ("NO" in operation S24), the pre-charge operation may be continued and/or repeated. When the voltage of the bit line reaches the second level, the pre-charge period for the bit line may be terminated, and the bit line may be switched to the pseudo-floated state (operation S25).

Thereafter, the voltage of the bit line may rise during the floating period, and it may be determined whether the voltage of the bit line has risen to a third level corresponding to the target voltage (operation S26). While the voltage of the bit line has not reached the third level ("NO" in operation S26), the floating period may be continued. When the voltage of the bit line reaches the third level, the memory device enters a data sensing period, and thus data may be sensed (operation S27).

In the above-described embodiment, an example in which the levels of the word line and the bit line are detected and the memory device enters various sections related to data reading has been described, but embodiments of the inventive concepts are not limited thereto. For example, a voltage detection operation may be performed on only one of the word line and the bit line, and entries to the floating period and the data sensing period may be controlled based thereon.

Figure 14A:
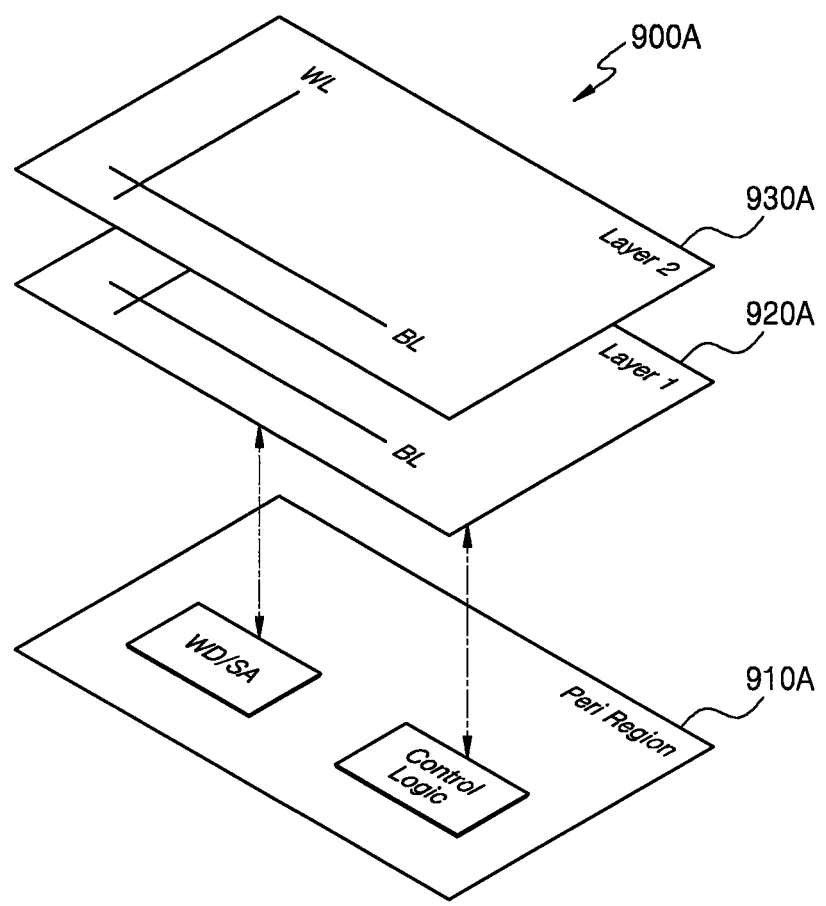
FIGS. 14A, 14B, 15A, and 15B are diagrams of examples of applying embodiments of the inventive concepts to a three-dimensional memory device.
Figure 14B:
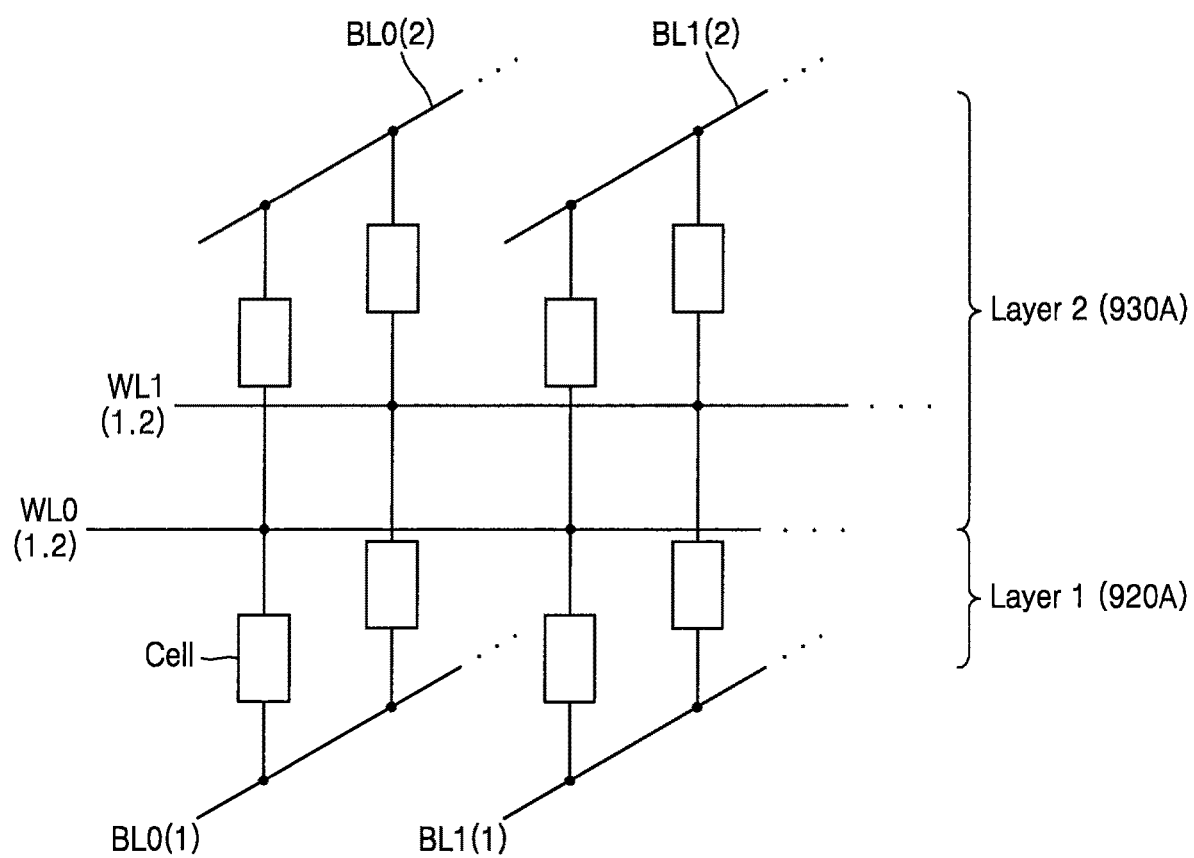

FIGS. 14A, 14B, 15A, and 15B are diagrams of examples of applying embodiments of the inventive concepts to a three-dimensional (3D) memory device. FIGS. 14A and 14B show that a memory device 900A includes first and second layers 920A, 930A, but a larger number of layers may be provided in the memory device 900A without deviating from the inventive concepts.

Referring to FIG. 14A, a memory device 900A may include a peri layer 910A in which a peri region including peripheral circuits are arranged, a first layer 920A (Layer 1), and a second layer 930A (Layer 2) in which memory cells are arranged. The first layer 920A and the second layer 930A may each include a plurality of memory cells and word lines and bit lines connected thereto. Also, although an example in which the peri layer 910A includes a write driver/sense amplifier (WD/SA) and control logic is shown in FIG. 14A, various types of peripheral circuits related to memory operations may be provided in the peri layer 910A. Also, in some embodiments, the write driver/sense amplifier may be shared by the first layer 920A and the second layer 930A.

FIG. 14B shows an example in which the first layer 920A and the second layer 930A share at least one line in a 3D memory device 900A. Although FIG. 14B shows an example in which the first layer 920A and the second layer 930A share a word line, the first layer 920A and the second layer 930A may also share a bit line. For example, the first layer 920A may read data by controlling bit lines BL0(1) and BL1(1) and word lines WL0(1,2) and WL1(1,2). Also, the second layer 930A may read data by controlling bit lines BL0(2) and BL1(2) and word lines WL0(1,2) and WL1(1,2).

In a plurality of layers constituting a stacked structure, a word line and/or a bit line of the second layer 930A may have larger capacitance components (or larger loading) than a word line and/or a bit line of the first layer 920A.

According to example embodiments of the inventive concepts, during a data read operation, the word line and/or bit line of the second layer 930A may be controlled differently from the word line and/or bit line of the first layer 920A.

Figure 15A:
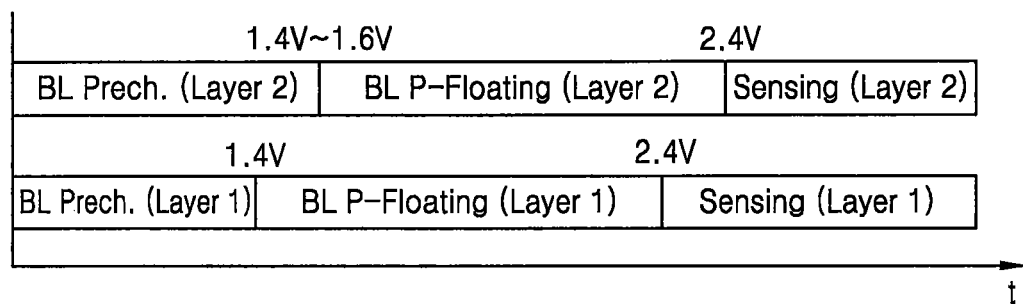
Figure 15B:
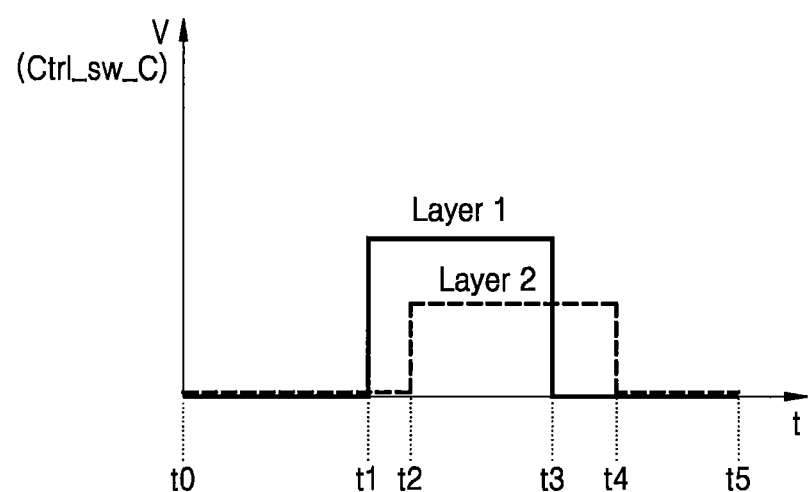

FIGS. 15A and 15B show an example in which bit lines are controlled differently from one layer to another. Referring to FIG. 15A, a pre-charge period for the bit line of the second layer 930A (Layer 2) may be longer than that of the first layer 920A (Layer 1) during a data reading operation. In other words, by setting a long pre-charge period for the bit line of the second layer 930A having a relatively larger capacitance component, the bit line of the second layer 930A may be pre-charged to 1.4 V.

According to an embodiment, due to the characteristic of a plurality of layers in a stacked structure, the threshold voltage (or a voltage difference in order to have on-cell characteristics) of memory cells of the second layer 930A may be greater as compared to the case of the first layer 920A. Therefore, the bit line of the second layer 930A may be pre-charged to a higher level (e.g., 1.6V) than that of the first layer 920A during the pre-charge period.

Although FIG. 15A shows that the pseudo-floating period for the first layer 920A and the pseudo-floating period for the second layer 930A have the same length, the length of the pseudo-floating periods may be variously set. Also, in each of the first layer 920A and the second layer 930A, data sensing may be performed after the voltage of the bit line is changed to a target voltage.

FIG. 15B shows an example of the column switch control signal Ctrl_sw_C for controlling column switches in the first layer 920A and the second layer 930A. For example, as described above, the bit line of the second layer 930A may have a relatively larger loading, and thus a column switch may be turned on more strongly than that of the first layer 920A during a pseudo-floating period t2 to t4 for the second layer 930A. In other words, when it is assumed that column switches are implemented as a PMOS transistor, the level of the column switch control signal Ctrl_sw_C provided to the second layer 930A during the pseudo-floating period t2 to t4 for the second layer 930A may be lower than the level of the column switch control signal Ctrl_sw_C provided to the first layer 920A during the pseudo-floating periods t1 to t3 for the first layer 920A.

Figure 16:
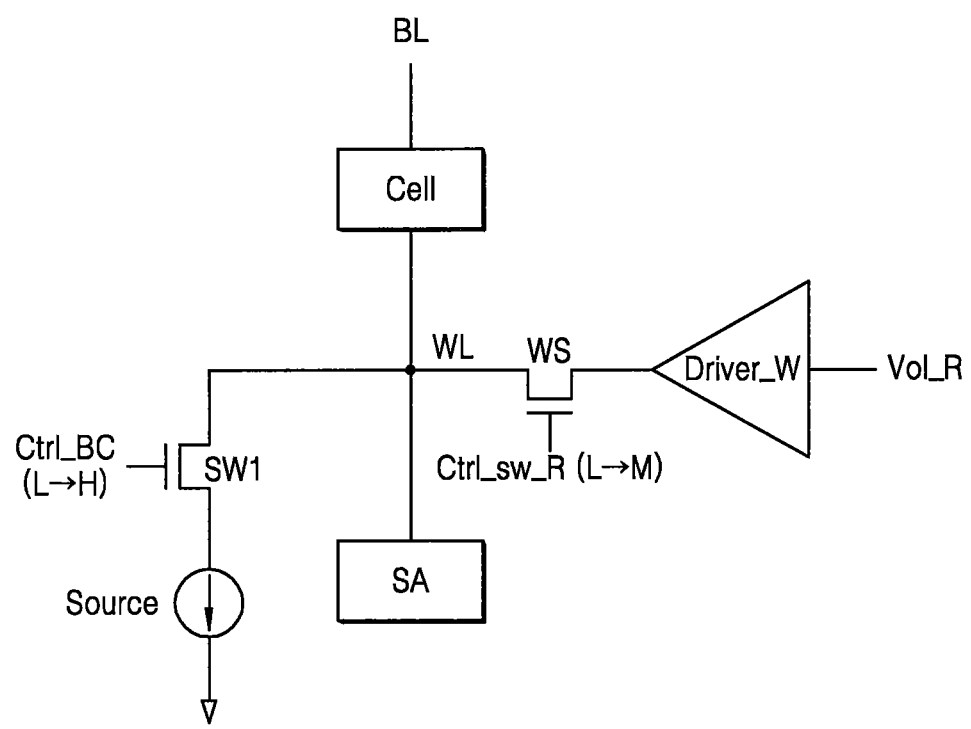
FIG. 16 is a circuit diagram of an example of compensating for a leakage current in a data read operation.

FIG. 16 is a circuit diagram showing an example of compensating for a leakage current in a data read operation.

According to the above-described embodiments, the word line WL may be floated during a data reading operation, and a leakage current may occur at the floated word line WL due to various factors (e.g., a plurality of memory cells connected to the word line WL), and thus the voltage level of the word line WL may be changed.

To compensate for influences of the leakage current, a control operation for the row switch WS may be performed or a compensation switch SW1 and a current source may be further connected to one node that is connected to a sense amplifier. The switching of the compensation switch SW1 may be controlled by a compensation control signal Ctrl_BC. Although an example in which both the row switch WS and the compensation switch SW1 are implemented as NMOS transistors is shown in FIG. 16, embodiments of the inventive concepts are not limited thereto.

To compensate for the leakage current occurring in the floated word line WL, the row switch control signal Ctrl_sw_C, which controls the row switch WS during a floating period, may be changed to a higher level (e.g., an intermediate level M) from a logic low level L (e.g., from L to M). Therefore, the row switch WS is weakly turned on, the first pre-charge voltage Vol_R is provided to the word line WL, and the leakage current may be compensated for.

Also, to compensate for the leakage current, the compensation control signal Ctrl_BC may be changed from a logic low level L to a logic high level H (e.g., from L to H), and thus the word line WL may be electrically connected to the current source. As a result, charges leaked from the word line WL may be compensated for by the current source.

In the embodiment shown in FIG. 16, the operation for compensating for the leakage current may be performed in various ways. For example, based on a result of detecting the voltage of the word line WL, a compensation operation using at least one of the row switch WS and the current source may be performed. In some embodiments, the characteristics of the word line WL may be determined during a manufacturing process and/or a test process of a memory device, and the memory device may be configured to apply the compensation operation when the memory device is initially driven.

Figure 17:
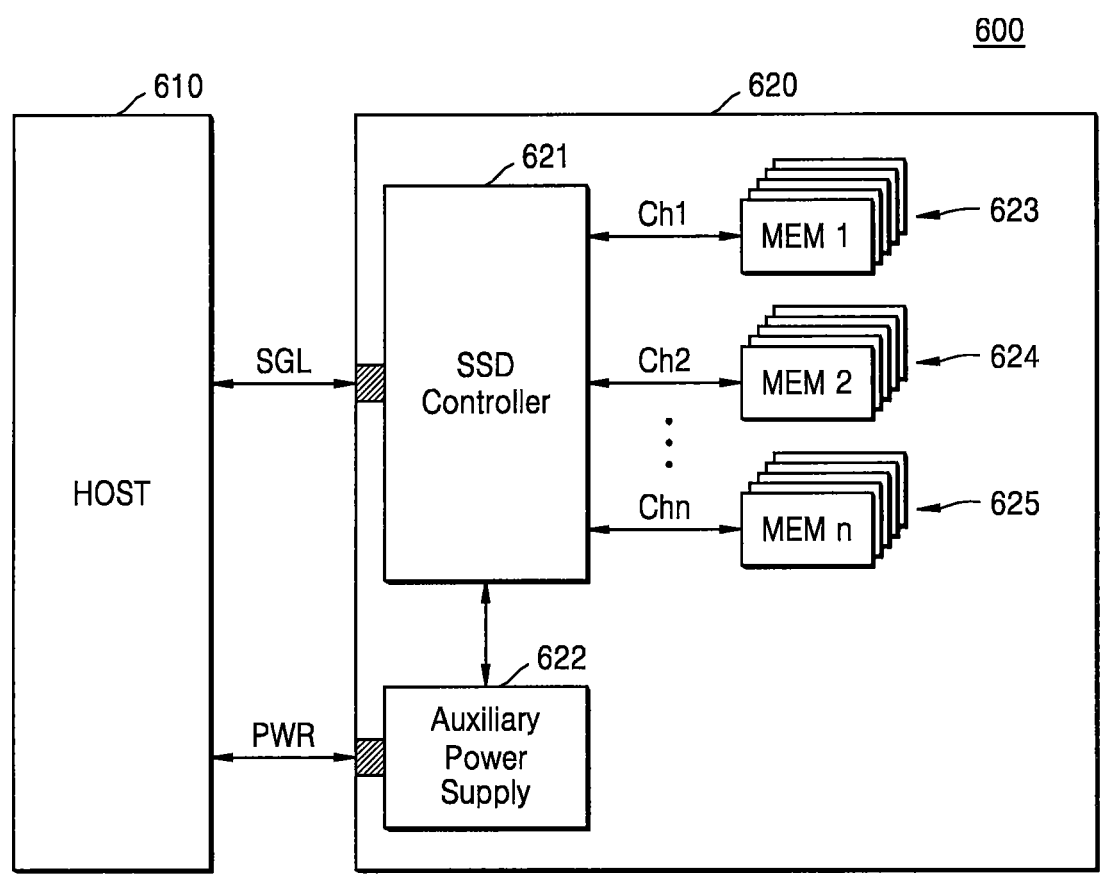
FIG. 17 is a block diagram of an example in which a memory device according to an embodiment of the inventive concepts is applied to an SSD system.

FIG. 17 is a block diagram of an example in which a memory device according to embodiments of the inventive concepts is applied to an SSD system 600.

Referring to FIG. 17, the SSD system 600 may include a host 610 and an SSD 620. The SSD 620 exchanges signals SGL with the host 610 through a signal connector and receives power PWR through a power connector. The SSD 620 may include an SSD controller 621, an auxiliary power supply device 622, and a plurality of memory systems 623, 624, and 625. The SSD controller 621 may be connected to the memory systems 623, 624, and 625 through a plurality of channels Ch1 to Chn, and the memory systems 623, 624 and 625 may each include a memory controller and a resistive memory device. Also, according to example embodiments of the inventive concepts, a resistive memory device may include memory device according to the above-described embodiments, thus a word line and a bit line connected to a selected word line may be controlled according to the above-described embodiments during data reading operations of the memory systems 623, 624, and 625.

Figure 18:
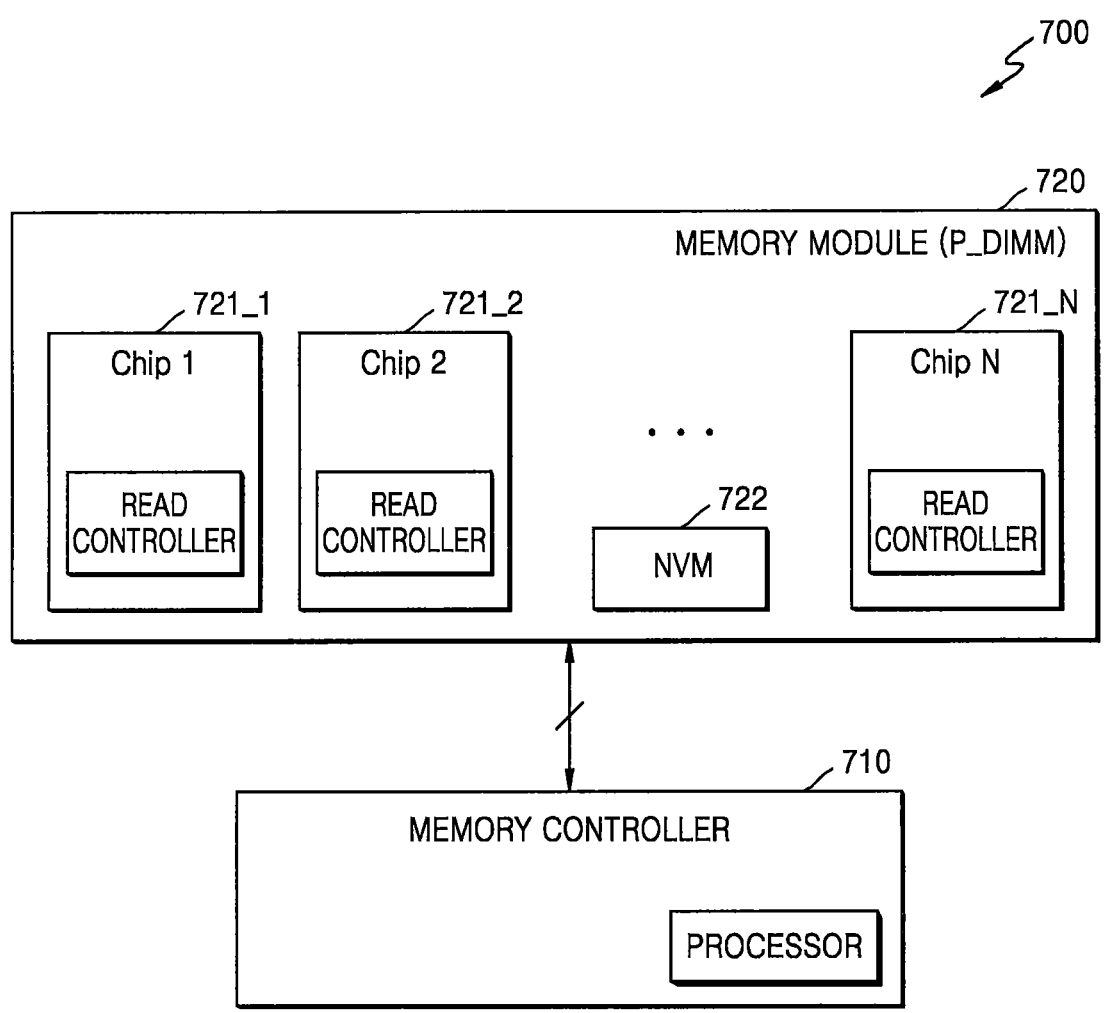
FIG. 18 is a block diagram of an implementation example of a memory system according to various embodiments of the inventive concepts.

FIG. 18 is a block diagram of an implementation example of a memory system 700 according to various embodiments of the inventive concept. FIG. 18 shows an example in which the memory system 700 includes a memory module 720 and a memory controller 710. The memory module 720 may correspond to a memory device of the above-described embodiments and/or may include a plurality of memory devices of the above-described embodiments.

Referring to FIG. 18, the memory controller 710 may include a processor that controls the overall operation of the memory system 700. Although not shown in FIG. 18, the memory controller 710 may further include various other components like a command/address generator, a host interface, and/or a memory interface as components for controlling memory operations.

The memory module 720 may include a plurality of memory chips mounted on a module board. For example, the memory module 720 may include first to Nth memory chips 721_1 to 721_N. Each of the first to Nth memory chips 721_1 to 721_N may correspond to a memory device according to the above-described embodiments, and accordingly, each of the first to Nth memory chips 721_1 to 721_N may include a read controller that performs various control operations related to data reading as in the above-described embodiments. For example, during a data read operation for the first to Nth memory chips 721_1 to 721_N, floating operations may be performed on a word line and a bit line connected to a selected memory cell together.

The memory module 720 may be implemented as a single in-line memory module (SIMM) or a dual in-line memory module (DIMM). Also, the memory module 720 may correspond to various types of DIMMs. For example, various types of DIMMs, such as, for example, a fully-buffered DIMM (FB-DIMM) and/or a load-reduction DIMM (LR-DIMM), may be applied to the memory module 720. In some embodiments, the memory module 720 may correspond to a non-volatile DIMM (NVDIMM) in which a non-volatile memory 722, such as, for example, a flash memory, is mounted to resolve a problem of volatile memory in which data is lost when power is turned off.

Also, as various types of modules, when the memory module 720 includes PRAM as a resistive memory, the memory module 720 may be referred to as a P_DIMM. Embodiments of the inventive concepts may be applied to various other types of modules. For example, as the memory module 720 includes cross-point memory chips having three-dimensional resistive memory cells, the memory module 720 may also be referred to as an XPoint DIMM (or a 3D XPoint DIMM).

When the memory module 720 corresponds to an NVDIMM, the memory module 720 may operate based on various types of specifications like NVDIMM-N and NVDIMM-P. Therefore, the non-volatile memory 722 may be used for data storage and/or buffering. Also, each of the first to Nth memory chips 721_1 to 721_N may operate based on a double date rate (DDR) for transmitting and receiving data at the rising edge and the falling edge of a clock. Furthermore, in some embodiments, a memory device according to the inventive concepts may also be used for implementing the non-volatile memory 722 of the memory module 720.

Figure 19:
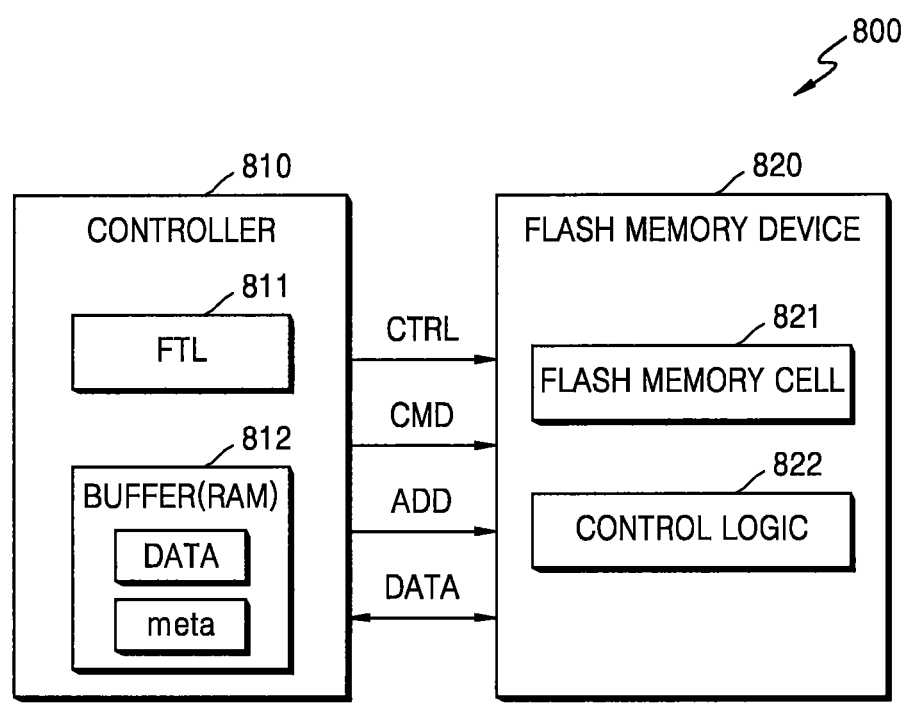
FIG. 19 is a block diagram of an example in which a memory device of an embodiment of the inventive concepts is used as a buffer of a controller.

FIG. 19 is a block diagram of an example in which a memory device of embodiments of the inventive concepts is used as a buffer of a controller 810.

Referring to FIG. 19, a memory system 800 may include the controller 810 and a flash memory device 820, and the flash memory device 820 may include a flash memory cell 821 and control logic 822. The memory controller 810 may include a flash translation layer (FTL) 811 and may include a buffer 812 for temporarily storing data DATA and metadata meta provided to the flash memory device 820. The controller 810 may control the flash memory device 820 to read data stored in the flash memory cell 821 and/or to program data to the flash memory cell 821 in response to a write/read request from a host. In detail, the controller 810 may provide an address ADDR, a command CMD, and/or a control signal CTRL to the flash memory device 820 to control a program operation, a read operation, and/or an erase operation for the flash memory device 820.

The buffer 812 may include a memory device according to the above-described embodiments, and thus the buffer 812 may include a resistive memory device. Also, according to the above-described embodiments, a data sensing operation may be performed based on pseudo-floating operations of the word line and/or the bit line for temporarily storing and reading data DATA and/or metadata meta in and from the resistive memory device.

In the above-described embodiments, it has been described that a memory device includes a resistive memory, but embodiments of the inventive concepts are not limited thereto. For example, embodiments of the inventive concepts may be applied to various types of memory devices that perform data sensing based on pre-charge operations on word lines and/or bit lines and may also be applied to various types of volatile and non-volatile memories, e.g., a DRAM, an SRAM, a flash memory device, etc.

While the inventive concepts have been particularly shown and described with reference to embodiments thereof, it will be understood that various changes in form and details may be made therein without departing from the scope of the following claims.

What is claimed is:

1. A memory device comprising:
a memory cell array comprising a plurality of memory cells connected to a plurality of word lines and a plurality of bit lines;
a row control circuit comprising a plurality of row switches corresponding to the word lines and configured to perform a selection operation on the word lines;
a column control circuit comprising a plurality of column switches corresponding to the bit lines and configured to perform a selection operation on the bit lines; and
a control logic circuit configured to control pre-charge operations on a word line of the plurality of word lines and a bit line of the plurality of bit lines connected to a selected memory cell and perform a control operation to float the word line and the bit line together after a pre-charge period during a data read operation,
wherein the word line is floated after the pre-charge period and the bit line is pseudo-floated after the pre-charge period.

2. The memory device of claim 1, further comprising:
a voltage generator configured to provide a first pre-charge voltage to the row control circuit and a second pre-charge voltage to the column control circuit; and
a write driver/sense amplifier configured to provide write data to the memory cell array through the row control circuit and to output read data from the memory cell array,
wherein the row control circuit comprises a word line driver configured to provide the first pre-charge voltage to the word line, and wherein a row switch of the plurality of row switches is configured to control an electrical connection between the word line driver and the word line, and
wherein the column control circuit comprises a bit line driver configured to provide the second pre-charge voltage to the bit line, and wherein a column switch of the plurality of column switches is configured to control an electrical connection between the bit line driver and the bit line.

3. The memory device of claim 1, wherein the memory cells comprise phase-change memory cells comprising a germanium (Ge), antimony (Sb), and tellurium (Te) mixture (GST).

4. The memory device of claim 1, wherein the control logic circuit is further configured to float the word line by providing a row switch control signal to the row switch connected to the word line and to pseudo-float the bit line by weakly turning on the column switch by providing a column switch control signal having a level between logic high and logic low to the column switch connected to the bit line.

5. The memory device of claim 1, wherein the data read operation further comprises a floating period and a data sensing period after the pre-charge period, and,
wherein, during the pre-charge period, the word line is pre-charged to a first level that corresponds to a negative target voltage, and the bit line is pre-charged to a third level lower than a second level that corresponds to a positive target voltage.

6. The memory device of claim 5, wherein, during the pre-charge period, a pre-charge voltage having the third level lower than that of the positive target voltage is provided to the bit line.

7. The memory device of claim 5, wherein the bit line comprises a first capacitance component that is larger than a second capacitance component of the word line, and,
wherein, during the pre-charge period, the bit line is provided with a pre-charge voltage having the second level corresponding to the positive target voltage, and the bit line is pre-charged to the third level lower than the second level due to loading based on the first capacitance component.

8. The memory device of claim 5, wherein, during the floating period, a voltage level of the bit line rises to the second level corresponding to the positive target voltage while the bit line is being pseudo-floated.

9. The memory device of claim 1, wherein the word line and the bit line are configured to be controlled separately from each other,
wherein the word line is floated and the bit line is pseudo-floated after the pre-charge period, and
wherein the pseudo-floating of the bit line is started during a period in which the word line is floated.

10. The memory device of claim 1, wherein a resistance state of the selected memory cell comprises a set state or a reset state, and
wherein, during the pre-charge period, a voltage level difference between the word line and the bit line is maintained below or equal to a reference value, such that the selected memory cell maintains off-cell characteristics in the set state and the reset state.

11. The memory device of claim 1, further comprising a compensation switch and a current source connected to a node of the word line,
wherein the compensation switch is configured to be turned on during a period in which the word line is floated to electrically connect the current source to the word line.

12. The memory device of claim 1, wherein the memory cells are arranged in a first layer and a second layer that are vertically stacked, and a bit line of the second layer comprises a larger capacitance component than that of the first layer, and
wherein, during the data read operation, a first time point for pseudo-floating the bit line of the second layer is different from a second time point for pseudo-floating a bit line of the first layer.

13. The memory device of claim 12, further comprising a third layer on the first layer and the second layer,
wherein the third layer comprises peripheral circuits that are configured to control write and read operations for memory cells of the first layer and the second layer.

14. A memory device comprising:
a selected memory cell that is configured to store data;
a first line and a second line connected to the selected memory cell;
a first switch configured to control an electrical connection between a first driver driving the first line and the first line in response to a first switch control signal; and
a second switch configured to control an electrical connection between a second driver driving the second line and the second line in response to a second switch control signal,
wherein a data read operation for the selected memory cell comprises a pre-charge period, a floating period, and a data sensing period, wherein, during the pre-charge period, the memory device is configured to provide a first pre-charge voltage corresponding to a negative target voltage to the first line, to provide a second pre-charge voltage corresponding to a positive target voltage to the second line, to pre-charge the first line to the negative target voltage, and to pre-charge the second line to a level lower than the positive target voltage, and, wherein, during the floating period, the memory device is further configured to float the first line and to pseudo-float the second line.

15. The memory device of claim 14, wherein at least a portion of a period in which the first line is floated overlaps a period in which the second line is pseudo-floated.

16. The memory device of claim 14, wherein, during the floating period, the memory device is further configured to turn off the first switch in response to the first switch control signal and to weakly turn on the second switch in response to the second switch control signal.

17. The memory device of claim 14, wherein, during the floating period, the memory device is further configured to raise a voltage of the second line to a level corresponding to the positive target voltage, and wherein, after the voltage of the second line rises to the positive target voltage, the memory device is further configured to sense the data by detecting a voltage of the first line during the data sensing period.

18. The memory device of claim 14, wherein the first switch and the second switch are controlled separately from each other, and wherein the memory device is further configured to start pseudo-floating the second line within a period in which the first line is floated.

19. A memory module comprising:
a module board;
a plurality of memory chips mounted on the module board; and
a non-volatile memory mounted on the module board and configured to communicate with the memory chips,
wherein each of the memory chips comprises:
a memory cell array comprising a plurality of memory cells connected to a plurality of word lines and a plurality of bit lines;
a row control circuit comprising a plurality of row switches corresponding to the word lines and configured to perform a selection operation on the word lines;
a column control circuit comprising a plurality of column switches corresponding to the bit lines and configured to perform a selection operation on the bit lines; and
a control logic circuit configured to control a pre-charge operation on a word line of the plurality of word lines and a bit line of the plurality of bit lines connected to a selected memory cell during a read operation and perform a control operation to float one of the word line and the bit line after a pre-charge period and to continue to provide a pre-charge voltage to the other one of the word line and the bit line after the pre-charge period,
wherein the read operation further comprises a floating period and a data sensing period after the pre-charge period, and
wherein, during the pre-charge period, the word line is pre-charged to a first level that corresponds to a negative target voltage, and the bit line is pre-charged to a third level lower than a second level that corresponds to a positive target voltage.

20. The memory module of claim 19, wherein, during the floating period, a voltage level of the bit line rises to the second level corresponding to the positive target voltage.

* * * * *